(12) United States Patent
Takuma et al.

(10) Patent No.: US 10,468,413 B2
(45) Date of Patent: Nov. 5, 2019

(54) METHOD FOR FORMING HYDROGEN-PASSIVATED SEMICONDUCTOR CHANNELS IN A THREE-DIMENSIONAL MEMORY DEVICE

(71) Applicant: SANDISK TECHNOLOGIES LLC, Plano, TX (US)

(72) Inventors: Shunsuke Takuma, Yokkaichi (JP); Seiji Shimabukuro, Yokkaichi (JP); Hirotada Tobita, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/947,378

(22) Filed: Apr. 6, 2018

(65) Prior Publication Data

US 2019/0312035 A1 Oct. 10, 2019

(51) Int. Cl.
*H01L 27/105* (2006.01)
*H01L 21/30* (2006.01)
*H01L 23/528* (2006.01)
*H01L 27/11529* (2017.01)
*H01L 25/065* (2006.01)
*H01L 27/11524* (2017.01)
*H01L 21/822* (2006.01)

(52) U.S. Cl.
CPC ...... *H01L 27/1052* (2013.01); *H01L 21/3003* (2013.01); *H01L 21/8221* (2013.01); *H01L 23/5283* (2013.01); *H01L 25/0652* (2013.01); *H01L 27/11524* (2013.01); *H01L 27/11529* (2013.01)

(58) Field of Classification Search
CPC .................................................. H01L 27/1052

USPC ........................................................ 257/315
See application file for complete search history.

(56) References Cited

U.S. PATENT DOCUMENTS

| 5,508,555 A * | 4/1996 | Brotherton ........ H01L 29/78609 257/221 |
| 5,915,167 A | 6/1999 | Leedy |
| 6,274,490 B1 | 8/2001 | Chyan et al. |

(Continued)

OTHER PUBLICATIONS

Endoh et al., "Novel Ultra High Density Memory with a Stacked-Surrounding Gate Transistor (S-SGT) Structured Cell," IEDM Proc. (2001) pp. 33-36.

(Continued)

*Primary Examiner* — Jami Valentine Miller
(74) *Attorney, Agent, or Firm* — The Marbury Law Group, PLLC

(57) ABSTRACT

A method of forming a three-dimensional memory device includes forming memory stack structures vertically extending through an alternating stack of insulating layers and electrically conductive layers over a substrate, such that each of the memory stack structures includes a memory film and a vertical semiconductor channel laterally surrounded by the memory film. The method also includes forming a stack of a first silicon nitride layer and a second silicon nitride layer over the memory stack structures, such that the first silicon nitride layer has a higher hydrogen-to-nitrogen ratio than the second silicon nitride layer, performing an anneal process at an elevated temperature to diffuse hydrogen from the first silicon nitride layer into the memory stack structures, and removing the first and second silicon nitride layers.

20 Claims, 32 Drawing Sheets

(56) References Cited

U.S. PATENT DOCUMENTS

| | | | |
|---|---|---|---|
| 6,677,213 | B1 | 1/2004 | Ramkumar et al. |
| 6,833,306 | B2 | 12/2004 | Lyding et al. |
| 7,459,403 | B1 * | 12/2008 | Devine ............ H01L 21/26506 438/778 |
| 8,829,593 | B2 | 9/2014 | Sekine et al. |
| 9,023,719 | B2 | 5/2015 | Pachamuthu et al. |
| 9,449,983 | B2 | 9/2016 | Yada et al. |
| 9,460,931 | B2 | 10/2016 | Pachamuthu et al. |
| 9,825,051 | B2 | 11/2017 | Rabkin et al. |
| 10,115,459 | B1 * | 10/2018 | Yamada ............ G11C 13/0002 |
| 2002/0063786 | A1 * | 5/2002 | Peek ................ H01L 27/14683 348/272 |
| 2009/0321855 | A1 | 12/2009 | Ashutosh et al. |
| 2010/0109071 | A1 | 5/2010 | Tanaka et al. |
| 2011/0045657 | A1 | 2/2011 | Kim et al. |
| 2012/0068247 | A1 | 3/2012 | Lee et al. |
| 2012/0273894 | A1 | 11/2012 | Chen et al. |
| 2013/0089974 | A1 | 4/2013 | Lee et al. |
| 2014/0225181 | A1 | 8/2014 | Makala et al. |
| 2015/0177184 | A1 * | 6/2015 | Brezeanu ............ G01N 27/4141 257/77 |
| 2016/0118391 | A1 | 4/2016 | Zhao et al. |
| 2017/0236835 | A1 | 8/2017 | Nakamura et al. |

OTHER PUBLICATIONS

Bu et al., "Design Considerations in Scaled SONOS Nonvolatile Memory Devices," Solid State Electronics, Elsevier Science Publishers, vol. 45, No. 1, pp. 113-120, XP004313662, (2001).

Yelundur et al., "Beneficial Impact of Low Frequency PECVD SIN X:H-Induced Hydrogenation in High-Efficiency String Ribbon Silicon Solar Cells," Nineteenth European Photovoltaic Solar Energy Conference: Proceedings of the International Conference, Paris, France, 4pgs, (2004).

International Application No. PCT/US2015/051484, International Search Report and Written Opinion, dated Dec. 1, 2015, 13 pages.

U.S. Appl. No. 15/581,575, filed Apr. 28, 2017, SanDisk Technologies LLC.

U.S. Appl. No. 15/605,204, filed May 25, 2017, SanDisk Technologies LLC.

U.S. Appl. No. 15/638,672, filed Jun. 30, 2017, SanDisk Technologies LLC.

U.S. Appl. No. 15/863,205, filed Jan. 5, 2018, SanDisk Technologies LLC.

* cited by examiner

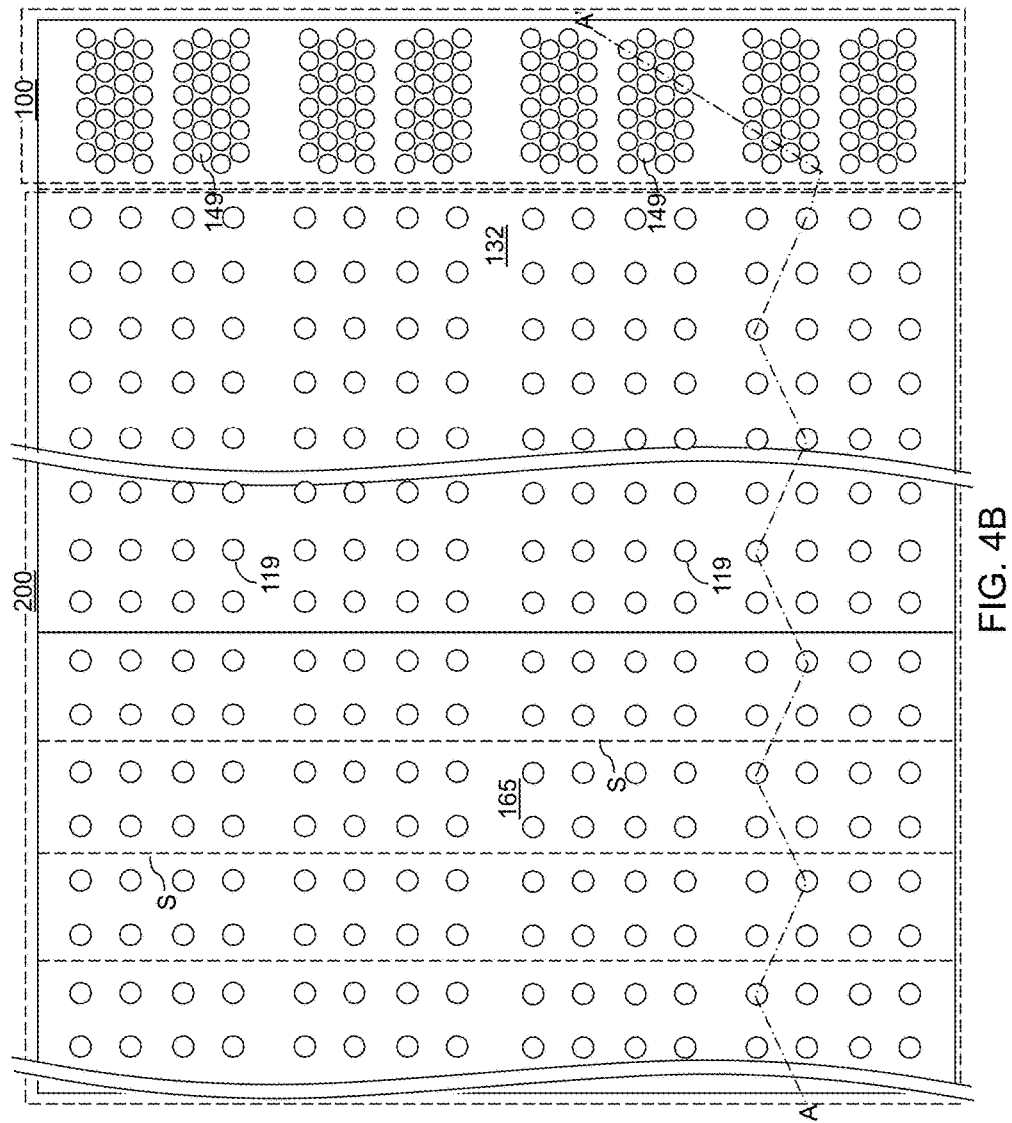

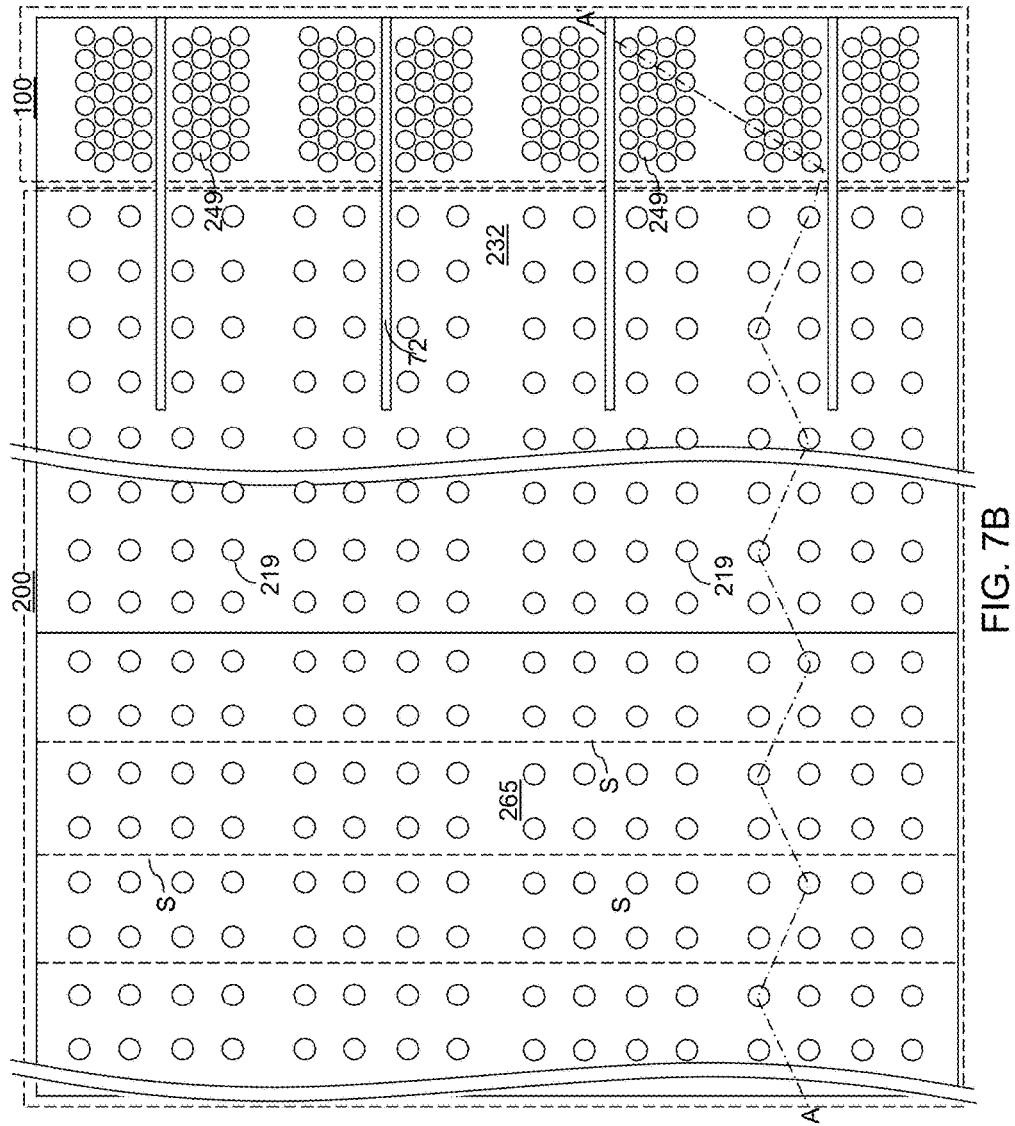

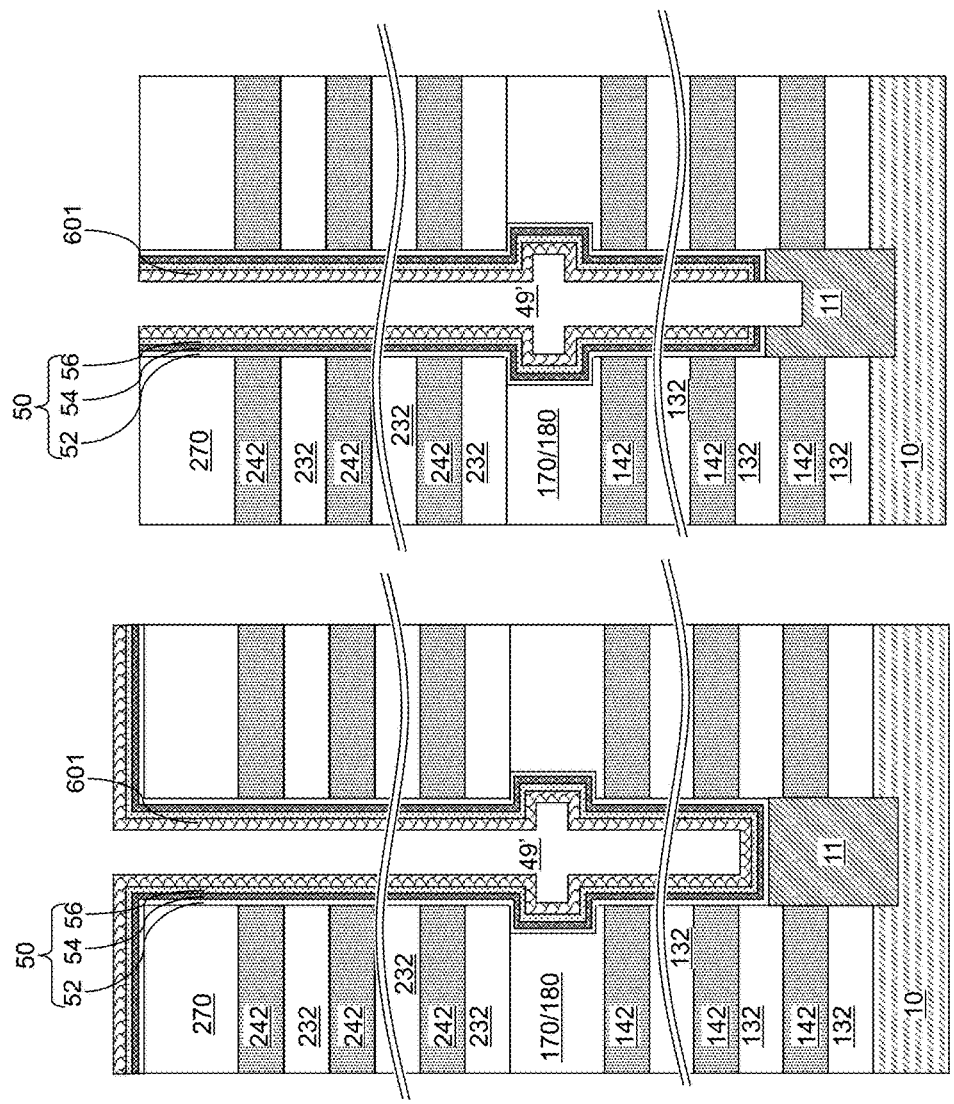

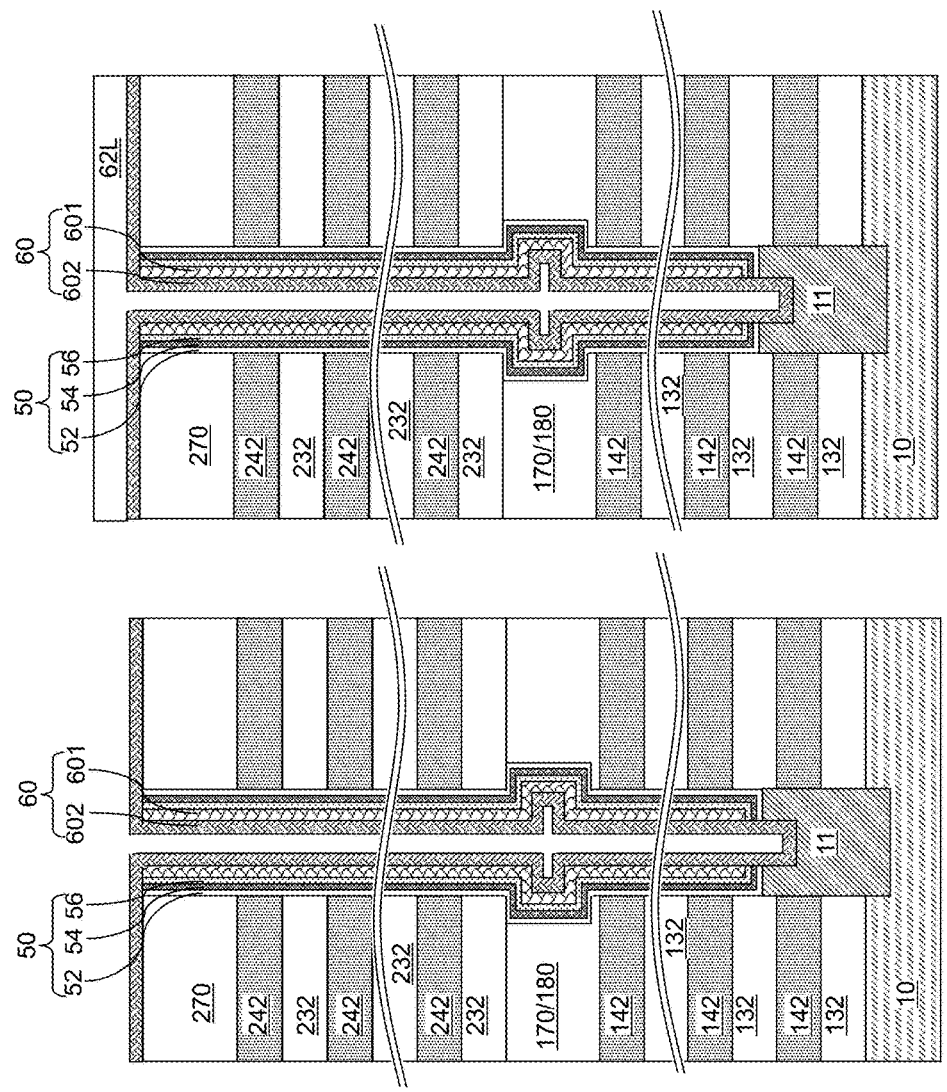

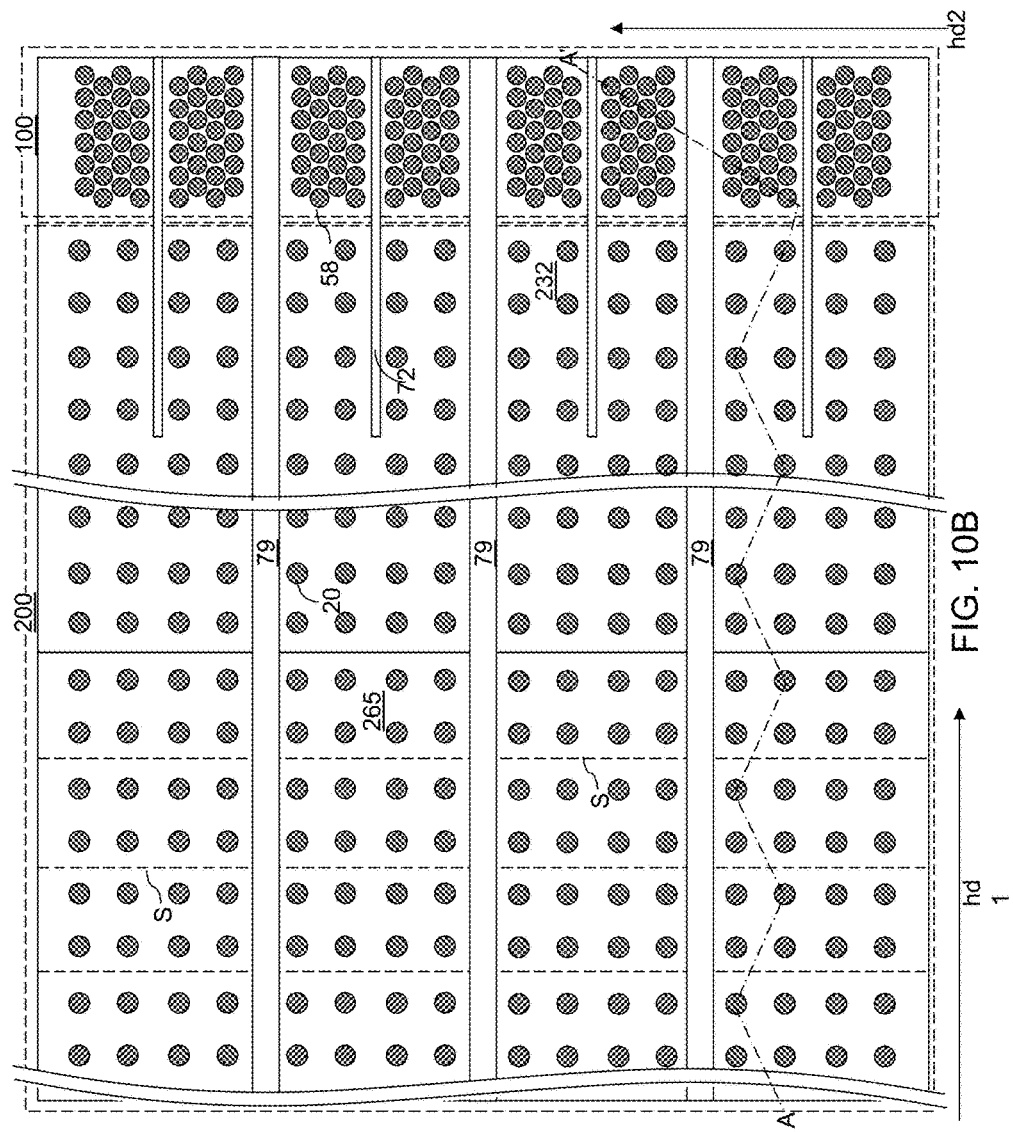

US 10,468,413 B2

METHOD FOR FORMING HYDROGEN-PASSIVATED SEMICONDUCTOR CHANNELS IN A THREE-DIMENSIONAL MEMORY DEVICE

FIELD

The present disclosure relates generally to the field of semiconductor devices and specifically to a method for forming a three-dimensional memory device including hydrogen-passivated semiconductor channels, and structures formed by the method.

BACKGROUND

Recently, ultra high density storage devices employing three-dimensional (3D) memory stack structures have been proposed. Such memory stack structures can employ an architecture known as Bit Cost Scalable (BiCS) architecture. For example, a 3D NAND stacked memory device can be formed from an array of an alternating stack of insulating materials and spacer material layers that are formed as electrically conductive layer or replaced with electrically conductive layers. Memory openings are formed through the alternating stack, and are filled with memory stack structures, each of which includes a vertical stack of memory elements and a vertical semiconductor channel. A memory-level assembly including the alternating stack and the memory stack structures is formed over a substrate. The electrically conductive layers can function as word lines of a 3D NAND stacked memory device, and bit lines overlying an array of memory stack structures can be connected to drain-side ends of the vertical semiconductor channels.

SUMMARY

According to an aspect of the present disclosure, a method of forming a three-dimensional memory device includes forming memory stack structures vertically extending through an alternating stack of insulating layers and electrically conductive layers over a substrate, such that each of the memory stack structures includes a memory film and a vertical semiconductor channel laterally surrounded by the memory film. The method also includes forming a stack of a first silicon nitride layer and a second silicon nitride layer over the memory stack structures, such that the first silicon nitride layer has a higher hydrogen-to-nitrogen ratio than the second silicon nitride layer, performing an anneal process at an elevated temperature to diffuse hydrogen from the first silicon nitride layer into the memory stack structures, and removing the first and second silicon nitride layers.

BRIEF DESCRIPTION OF THE DRAWINGS

FIG. 4B is a horizontal cross-sectional view of the exemplary structure along the horizontal plane B-B' in FIG. 4A. The zig-zag vertical plane A-A' corresponds to the plane of the vertical cross-sectional view of FIG. 4A.

FIG. 7B is a horizontal cross-sectional view of the exemplary structure along the horizontal plane B-B' in FIG. 7A. The zig-zag vertical plane A-A' corresponds to the plane of the vertical cross-sectional view of FIG. 7A.

FIGS. 9A-9H are sequential vertical cross-sectional views of an inter-tier memory opening during formation of a pillar channel portion, a memory stack structure, a dielectric core, and a drain region according to an embodiment of the present disclosure.

FIG. 10B is a horizontal cross-sectional view of the exemplary structure along the horizontal plane B-B' in FIG. 10A. The zig-zag vertical plane A-A' corresponds to the plane of the vertical cross-sectional view of FIG. 10A.

13A. The zig-zag vertical plane A-A' corresponds to the plane of the vertical cross-sectional view of FIG. 13A.

Figure 14:
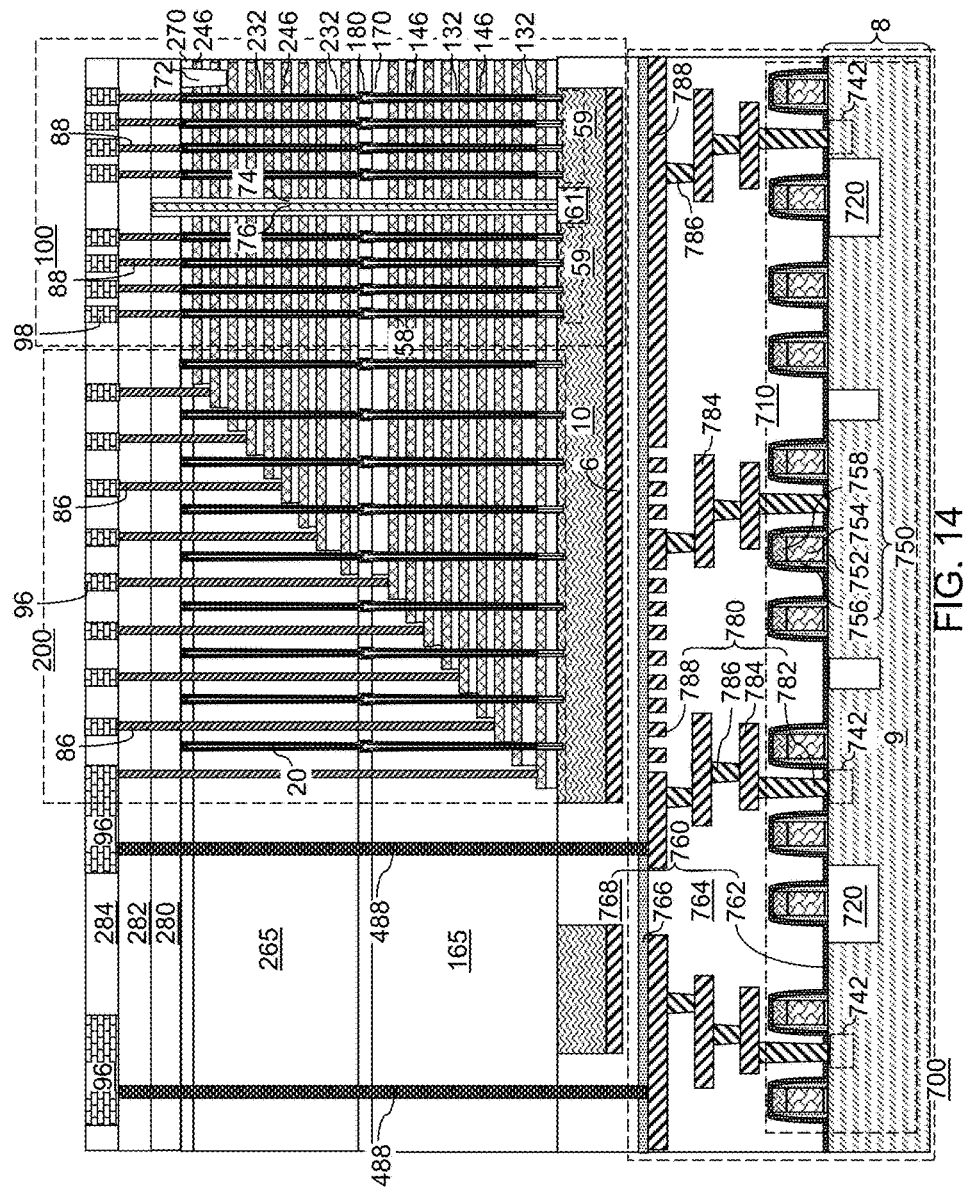

FIG. 14 is a vertical cross-sectional view of the exemplary structure after formation of upper metal line structures according to an embodiment of the present disclosure.

Figure 15A:
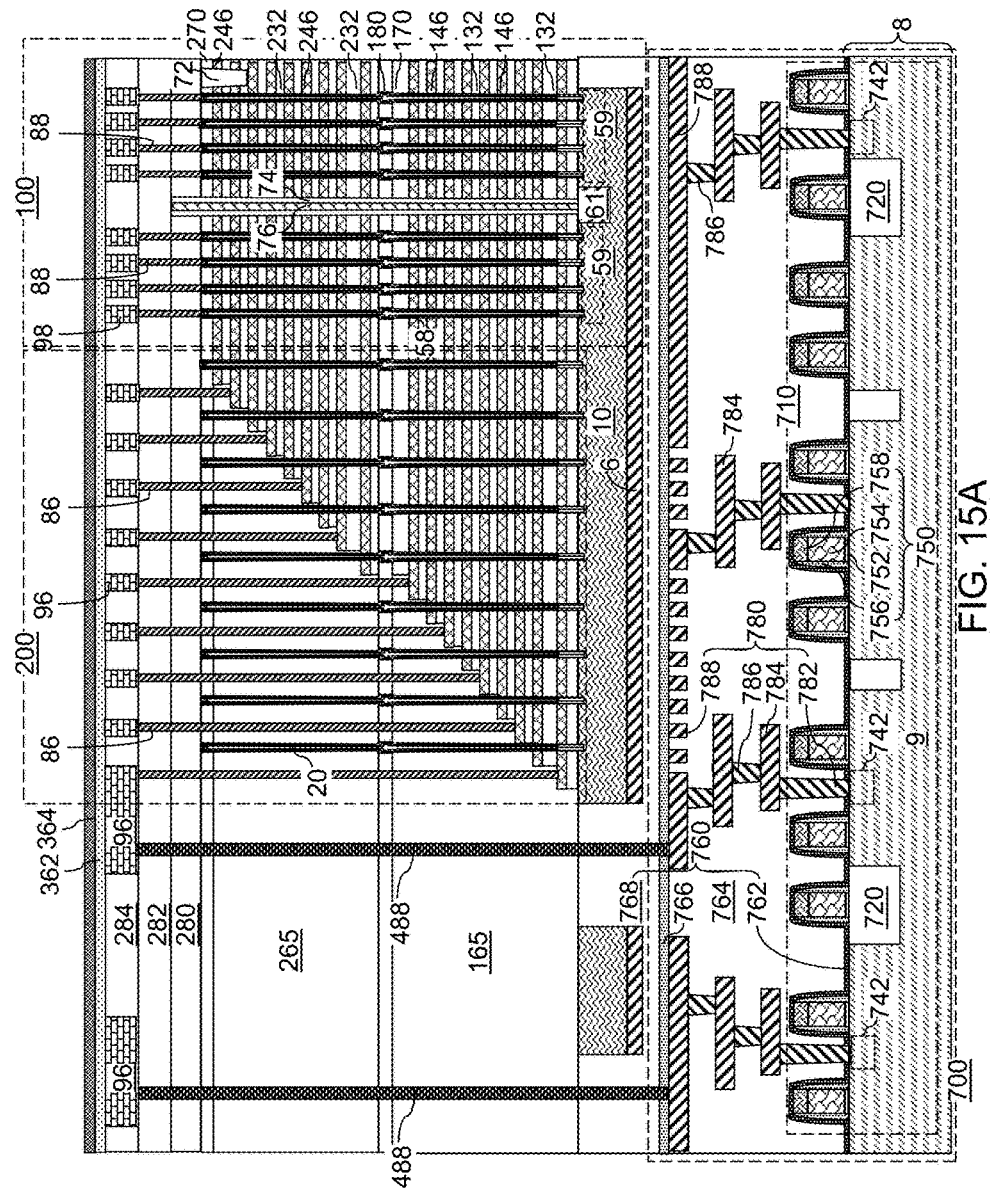

FIG. 15A is a vertical cross-sectional view of the exemplary structure after formation of a first silicon nitride layer and a second silicon nitride layer according to an embodiment of the present disclosure.

Figure 15B:
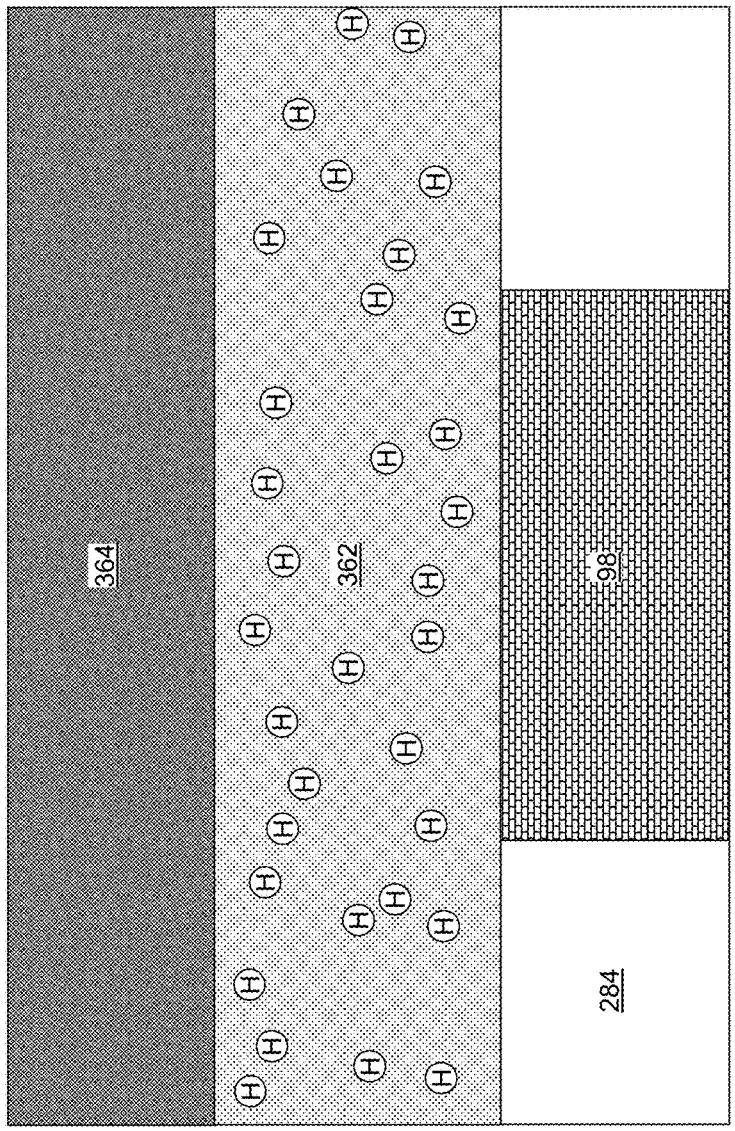

FIG. 15B is a magnified view of a region of the vertical cross-sectional view of FIG. 15A.

Figure 15C:
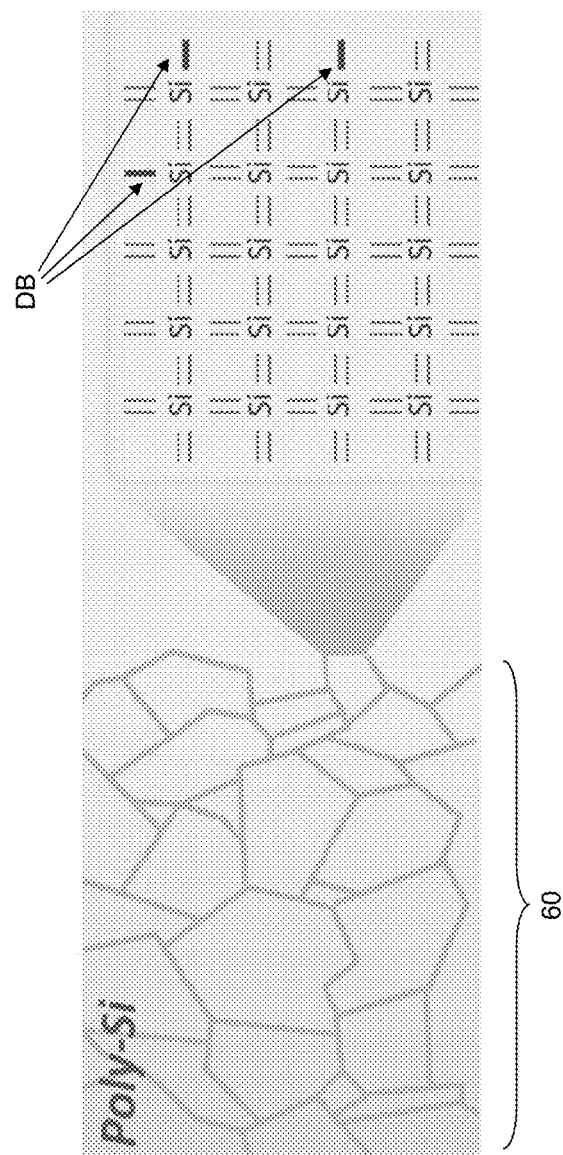

FIG. 15C is a schematic view of a region within a vertical semiconductor channel in FIG. 15A.

Figure 16A:
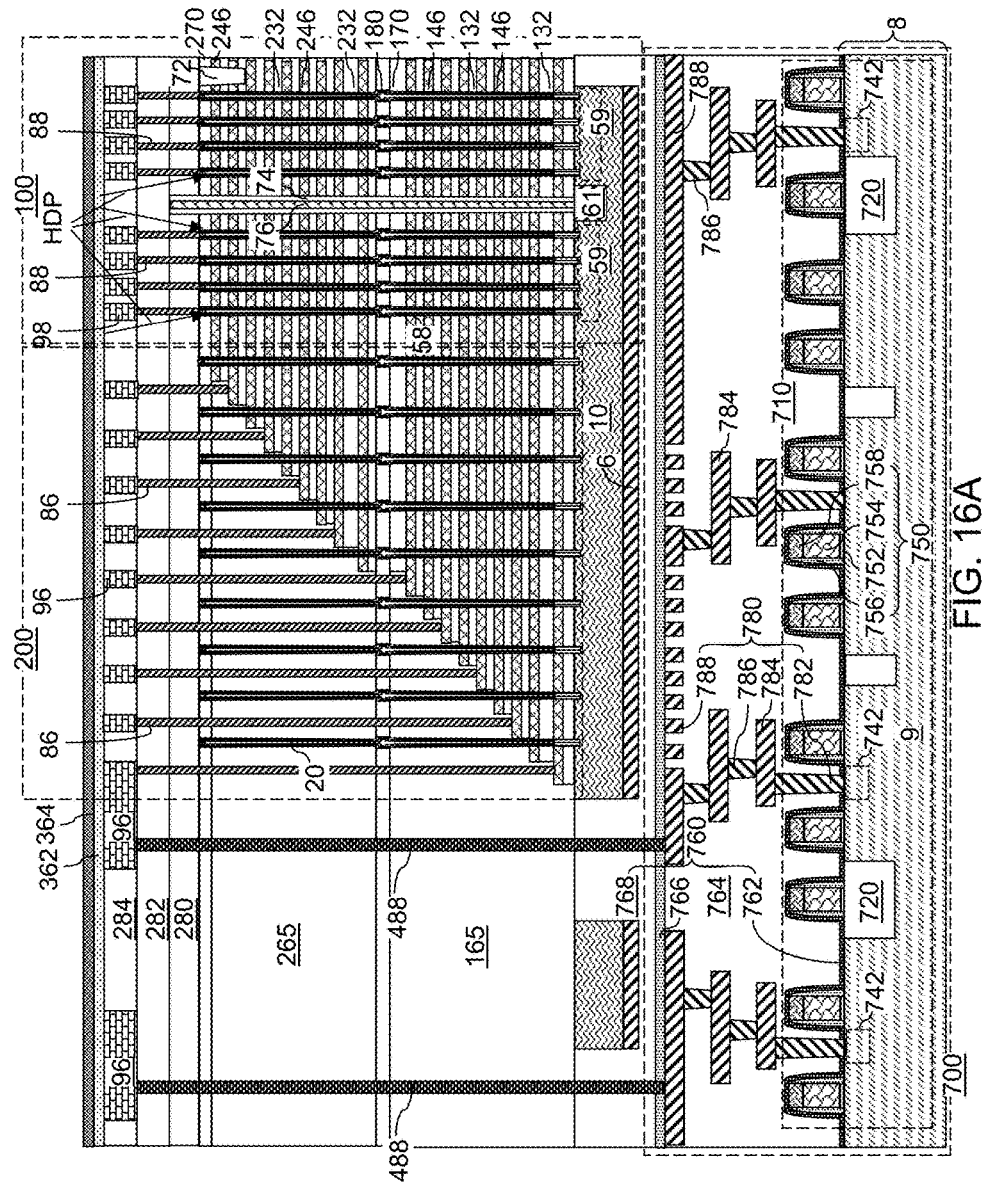

FIG. 16A is a vertical cross-sectional view of the exemplary structure during an anneal process according to an embodiment of the present disclosure.

Figure 16B:
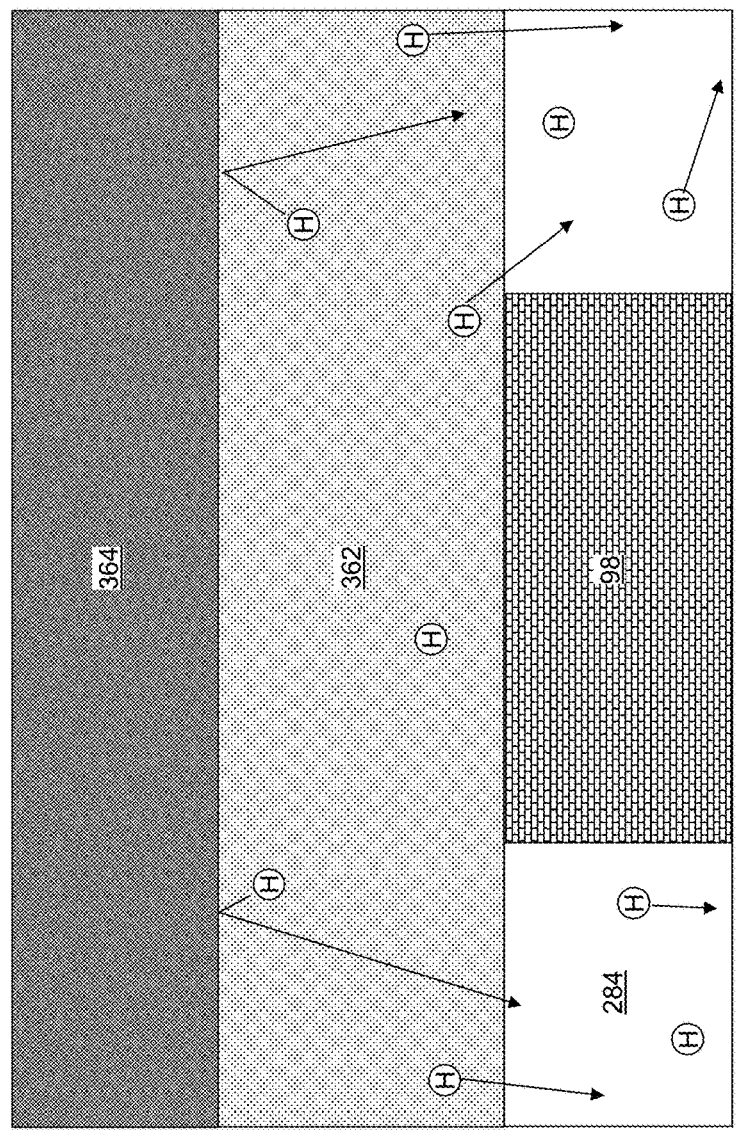

FIG. 16B is a magnified view of a region of the vertical cross-sectional view of FIG. 16A.

Figure 16C:
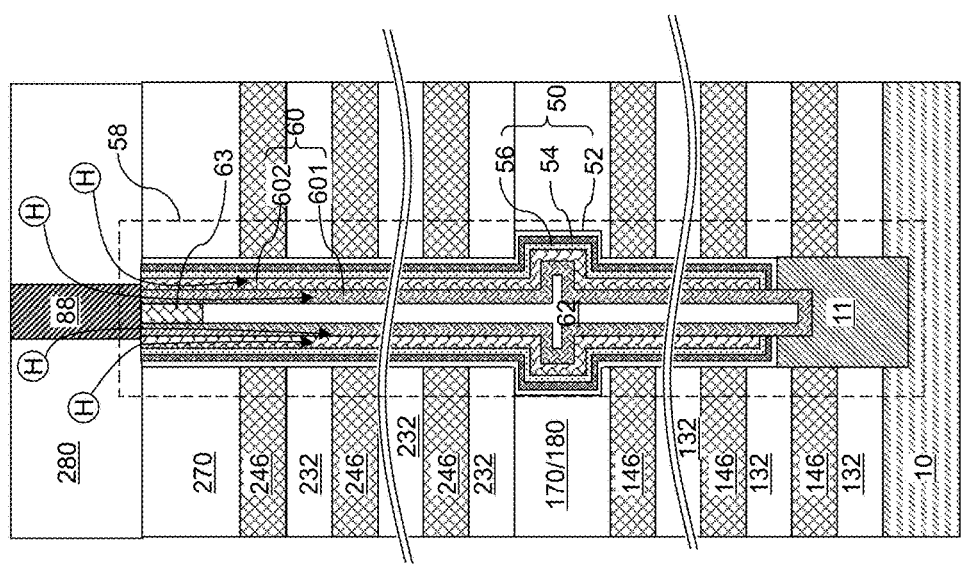

FIG. 16C is a magnified view of another region of the vertical cross-sectional view of FIG. 16A.

Figure 16D:
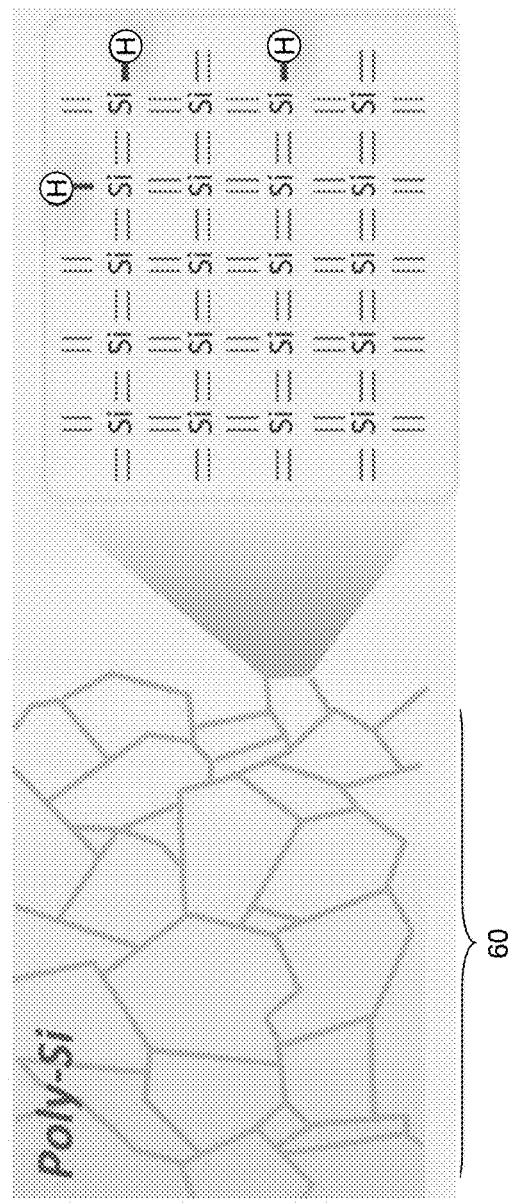

FIG. 16D is a schematic view of a region within a vertical semiconductor channel in FIG. 16A.

Figure 17:
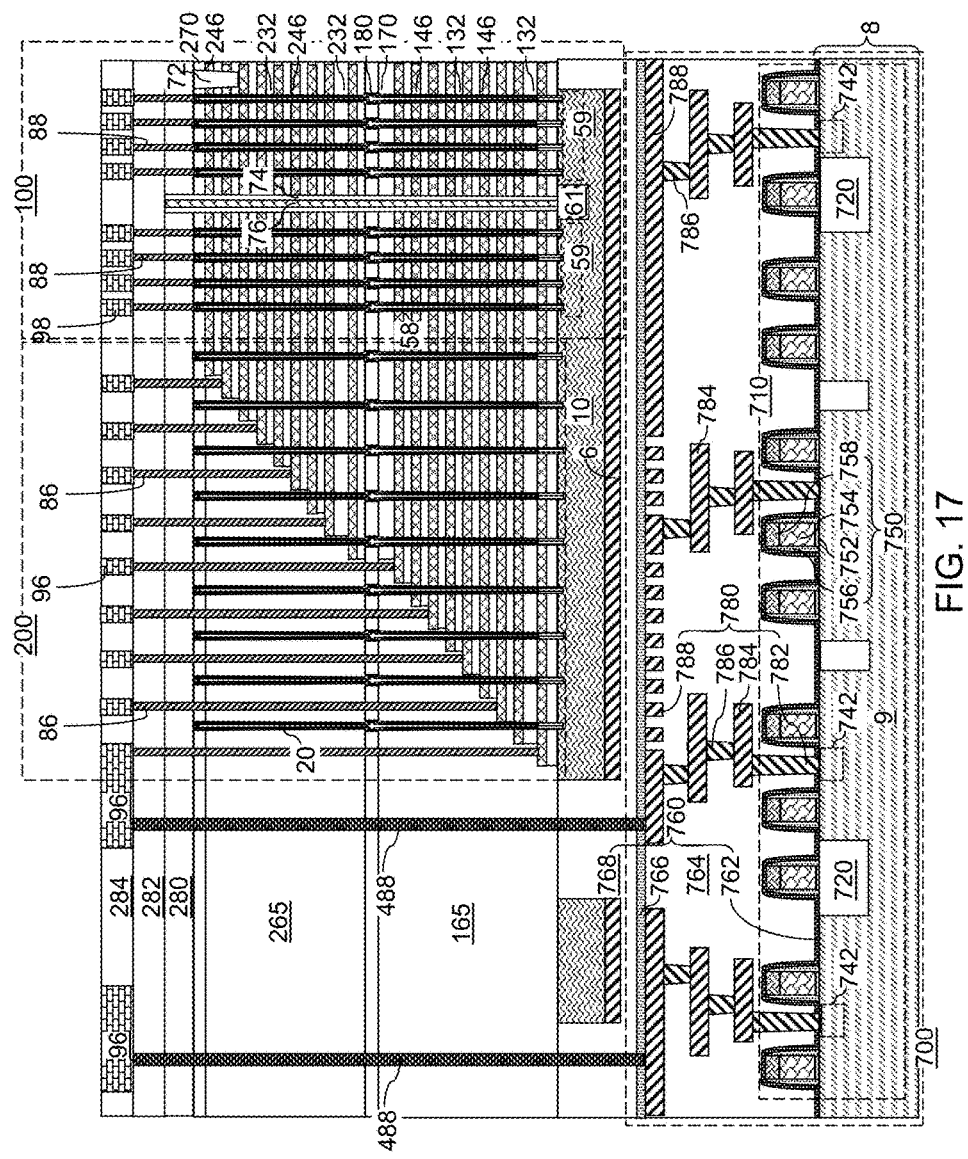

FIG. 17 is a vertical cross-sectional view of the exemplary structure after removal of the first and second silicon nitride layers according to an embodiment of the present disclosure.

Figure 18:
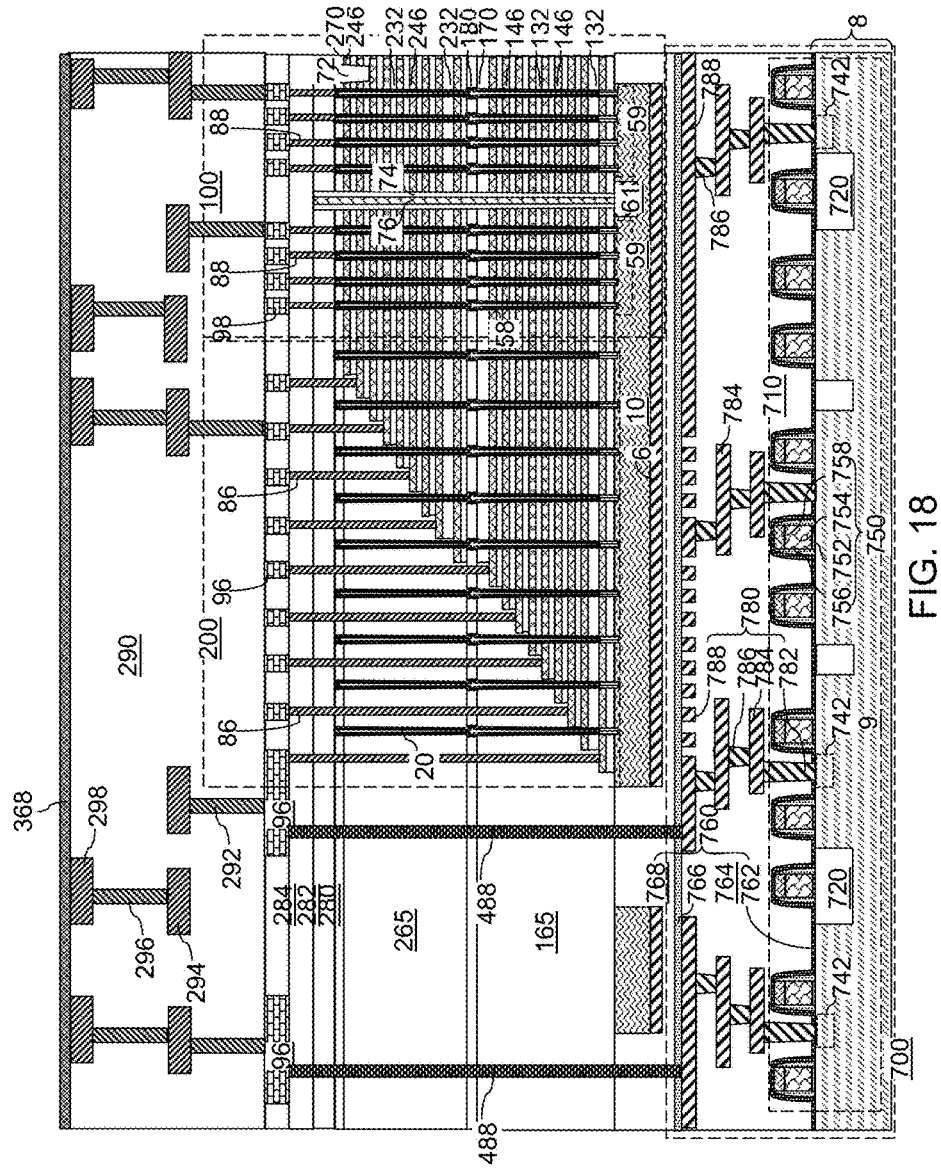

FIG. 18 is a vertical cross-sectional view of the exemplary structure after formation of at least one interconnect level dielectric layer embedding metal interconnect structures and a passivation silicon nitride layer according to an embodiment of the present disclosure.

DETAILED DESCRIPTION

Charge carrier mobility in the vertical semiconductor channels is affected by dangling bonds that are present at the grain boundaries of the vertical semiconductor channels. The present inventors realized that while hydrogen passivation can reduce dangling bonds in the vertical semiconductor channels of the memory device, hydrogen atoms generally produce deleterious effects in underlying driver circuit CMOS devices.

In embodiments of the present disclosure, a method is provided for enhancing charge carrier mobility in the vertical semiconductor channels of memory stack structures while minimizing introducing hydrogen atoms into underlying driver circuit CMOS devices. Embodiments of the present disclosure provide a method for forming a three-dimensional memory device including hydrogen-passivated semiconductor channels using two silicon nitride layers with different hydrogen concentrations overlying the semiconductor channels. The lower silicon nitride layer contains more hydrogen than the upper silicon nitride layer. The lower silicon nitride layer acts as a hydrogen source for passivating the dangling bonds in the semiconductor channels, while the upper silicon nitride layer acts as a hydrogen barrier to reduce or prevent diffusion of hydrogen from the lower silicon nitride layer into the ambient. The embodiments of the present disclosure can be employed to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Unless otherwise indicated, a "contact" between elements refers to a direct contact between elements that provides an edge or a surface shared by the elements. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between or at a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and can be fabricated employing the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Figure 1:
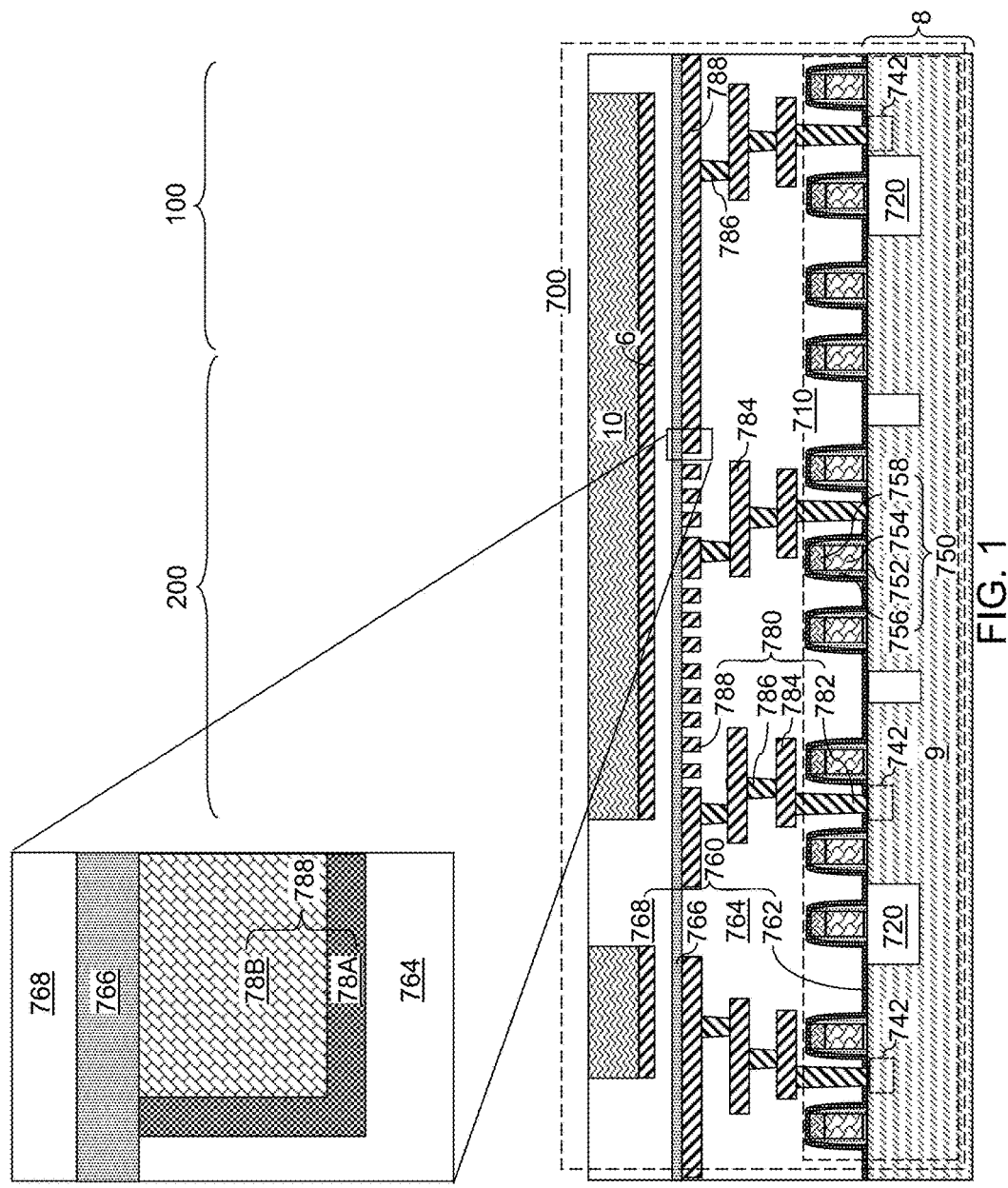
FIG. 1 is a vertical cross-sectional view of an exemplary structure after formation of semiconductor devices, lower level dielectric layers including a silicon nitride layer, lower metal interconnect structures, and a planar semiconductor material layer on a semiconductor substrate according to a first embodiment of the present disclosure.

Referring to FIG. 1, an exemplary structure according to an embodiment of the present disclosure is illustrated. The exemplary structure includes a semiconductor substrate 8, and semiconductor devices 710 formed thereupon. The semiconductor substrate 8 includes a substrate semiconductor layer 9 at least at an upper portion thereof. Shallow trench isolation structures 720 can be formed in an upper portion of the substrate semiconductor layer 9 to provide electrical isolation among the semiconductor devices. The semiconductor devices 710 can include, for example, field effect transistors including respective transistor active regions 742 (i.e., source regions and drain regions), channel regions 746 and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that can be implemented outside a memory array structure for a memory device. For example, the semiconductor devices can include word line switching devices for electrically biasing word lines of three-dimensional memory structures to be subsequently formed.

Dielectric material layers are formed over the semiconductor devices, which is herein referred to as lower level dielectric layers 760. The lower level dielectric layers 760 constitute a dielectric layer stack in which each lower level dielectric layer 760 overlies or underlies other lower level dielectric layers 760. The lower level dielectric layers 760 can include, for example, a dielectric liner 762 such as a silicon nitride liner that blocks diffusion of mobile ions and/or apply appropriate stress to underlying structures, at least one first dielectric material layer 764 that overlies the dielectric liner 762, a silicon nitride diffusion barrier layer 766 (e.g., hydrogen diffusion barrier) that overlies the dielectric material layer 764, and at least one second dielectric layer 768. In one embodiment, the silicon nitride diffusion barrier layer 766 can have a hydrogen-to-nitrogen ratio less than 0.01, which may be less than 0.005. As used herein, a hydrogen-to-nitrogen ratio in a silicon nitride material refers to the atomic ratio of the hydrogen atoms to the nitrogen atoms. Typical silicon nitride has a hydrogen-to-nitrogen ratio of about 0.02. In one embodiment, the silicon nitride diffusion barrier layer 766 can be deposited by a low pressure chemical vapor deposition (LPCVD) process employing dichlorosilane (DCS) and ammonia as reactant gases to provide a low hydrogen-to-nitrogen ratio.

The dielectric layer stack including the lower level dielectric layers 760 functions as a matrix for lower metal interconnect structures 780 that provide electrical wiring among the various nodes of the semiconductor devices and landing pads for through-stack contact via structures to be subsequently formed. The lower metal interconnect structures 780 are embedded within the dielectric layer stack of the lower level dielectric layers 760, and comprise a lower metal line structure located under and optionally contacting a bottom surface of the silicon nitride diffusion barrier layer 766.

For example, the lower metal interconnect structures 780 can be embedded within the at least one first dielectric material layer 764. The at least one first dielectric material layer 764 may be a plurality of dielectric material layers in which various elements of the lower metal interconnect structures 780 are sequentially embedded. Each dielectric material layer among the at least one first dielectric material layer 764 may include any of doped silicate glass, undoped silicate glass, organosilicate glass, silicon nitride, silicon oxynitride, and dielectric metal oxides (such as aluminum oxide). In one embodiment, the at least one first dielectric material layer 764 can comprise, or consist essentially of, dielectric material layers having dielectric constants that do not exceed the dielectric constant of undoped silicate glass (silicon oxide) of 3.9.

The lower metal interconnect structures 780 can include various device contact via structures 782 (e.g., source and drain electrodes which contact the respective source and drain nodes of the device or gate electrode contacts), intermediate lower metal line structures 784, lower metal via structures 786, and topmost lower metal line structures 788 that are configured to function as landing pads for through-stack contact via structures to be subsequently formed. In this case, the at least one first dielectric material layer 764 may be a plurality of dielectric material layers that are formed level by level while incorporating components of the lower metal interconnect structures 780 within each respective level. For example, single damascene processes may be employed to form the lower metal interconnect structures 780, and each level of the lower metal via structures 786 may be embedded within a respective via level dielectric material layer and each level of the lower level metal line structures (784, 788) may be embedded within a respective line level dielectric material layer. Alternatively, a dual damascene process may be employed to form integrated line and via structures, each of which includes a lower metal line structure and at least one lower metal via structure.

The topmost lower metal line structures 788 can be formed within a topmost dielectric material layer of the at least one first dielectric material layer 764 (which can be a plurality of dielectric material layers). Each of the lower metal interconnect structures 780 can include a metallic nitride liner 78A and a metal fill portion 78B. Each metallic nitride liner 78A can include a conductive metallic nitride material such as TiN, TaN, and/or WN. Each metal fill portion 78B can include an elemental metal (such as Cu, W, Al, Co, Ru) or an intermetallic alloy of at least two metals. Top surfaces of the topmost lower metal line structures 788 and the topmost surface of the at least one first dielectric material layer 764 may be planarized by a planarization process, such as chemical mechanical planarization. In this case, the top surfaces of the topmost lower metal line structures 788 and the topmost surface of the at least one first dielectric material layer 764 may be within a horizontal plane that is parallel to the top surface of the substrate 8.

The silicon nitride diffusion barrier layer 766 can be formed directly on the top surfaces of the topmost lower metal line structures 788 and the topmost surface of the at least one first dielectric material layer 764. Alternatively, a portion of the first dielectric material layer 764 can be located on the top surfaces of the topmost lower metal line structures 788 below the silicon nitride diffusion barrier layer 766. In one embodiment, the silicon nitride diffusion barrier layer 766 is a substantially stoichiometric silicon nitride layer which has a composition of $Si_3N_4$. A silicon nitride material formed by thermal decomposition of a silicon nitride precursor is preferred for the purpose of blocking hydrogen diffusion. In one embodiment, the silicon nitride diffusion barrier layer 766 can be deposited by a low pressure chemical vapor deposition (LPCVD) employing dichlorosilane ($SiH_2Cl_2$) and ammonia ($NH_3$) as precursor gases. The temperature of the LPCVD process may be in a range from 750 degrees Celsius to 825 degrees Celsius, although lesser and greater deposition temperatures can also be employed. The sum of the partial pressures of dichlorosilane and ammonia may be in a range from 50 mTorr to 500 mTorr, although lesser and greater pressures can also be employed. The thickness of the silicon nitride diffusion barrier layer 766 is selected such that the silicon nitride diffusion barrier layer 766 functions as a sufficiently robust hydrogen diffusion barrier for subsequent thermal processes. For example, the thickness of the silicon nitride diffusion barrier layer 766 can be in a range from 6 nm to 100 nm, although lesser and greater thicknesses may also be employed.

Generally, semiconductor devices can be formed on a top surface of a substrate 8 and lower interconnect level dielectric layers (762, 764) embedding lower metal interconnect structures 780 therein are formed over the semiconductor devices. The lower metal interconnect structures 780 are electrically connected to a respective one of the semiconductor devices. A silicon nitride diffusion barrier layer 766 may be formed over the lower interconnect level dielectric layer (762, 764). The silicon nitride diffusion barrier layer 766 can block diffusion of hydrogen atoms therethrough during a subsequent anneal process.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material can be deposited over, or within patterned recesses of, the at least one second dielectric material layer 768, and is lithographically patterned to provide an optional planar conductive material layer 6 and a planar semiconductor material layer 10. The optional planar conductive material layer 6, if present, provides a high conductivity conduction path for electrical current that flows into, or out of, the planar semiconductor material layer 10. The optional planar conductive material layer 6 includes a conductive material such as a metal or a heavily doped semiconductor material. The optional planar conductive material layer 6, for example, may include a tungsten layer having a thickness in a range from 3 nm to 100 nm, although lesser and greater thicknesses can also be employed. A metal nitride layer (not shown) may be provided as a diffusion barrier layer on top of the planar conductive material layer 6. Layer 6 may function as a special source line in the completed device. Alternatively, layer 6 may comprise an etch stop layer and may comprise any suitable conductive, semiconductor or insulating layer.

The planar semiconductor material layer 10 can include horizontal semiconductor channels and/or source regions for a three-dimensional array of memory devices to be subsequently formed. The optional planar conductive material layer 6 can include a metallic compound material such as a conductive metallic nitride (e.g., TiN) and/or a metal (e.g., W). The thickness of the optional planar conductive material layer 6 may be in a range from 5 nm to 100 nm, although lesser and greater thicknesses can also be employed. The planar semiconductor material layer 10 includes a polycrystalline semiconductor material such as polysilicon or a polycrystalline silicon-germanium alloy. The thickness of the planar semiconductor material layer 10 may be in a range from 30 nm to 300 nm, although lesser and greater thicknesses can also be employed.

The planar semiconductor material layer 10 includes a semiconductor material, which can include at least one elemental semiconductor material, at least one III-V compound semiconductor material, at least one II-VI compound semiconductor material, at least one organic semiconductor material, and/or other semiconductor materials known in the art. In one embodiment, the planar semiconductor material layer 10 can include a polycrystalline semiconductor material (such as polysilicon), or an amorphous semiconductor material (such as amorphous silicon) that is converted into a polycrystalline semiconductor material in a subsequent processing step (such as an anneal step). The planar semiconductor material layer 10 can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 9).

In one embodiment, the planar semiconductor material layer 10 or portions thereof can be doped with electrical dopants, which may be p-type dopants or n-type dopants. The conductivity type of the dopants in the planar semiconductor material layer 10 is herein referred to as a first conductivity type.

The optional planar conductive material layer 6 and the planar semiconductor material layer 10 may be patterned to provide openings in areas in which through-stack contact via structures and through-dielectric contact via structures are to be subsequently formed. In one embodiment, the openings in the optional planar conductive material layer 6 and the planar semiconductor material layer 10 can be formed within the area of a memory array region 100, in which a three-dimensional memory array including memory stack structures is to be subsequently formed. Further, additional openings in the optional planar conductive material layer 6 and the planar semiconductor material layer 10 can be formed within the area of a word line contact region 200 in which contact via structures contacting word line electrically conductive layers are to be subsequently formed.

The region of the semiconductor devices 710 and the combination of the lower level dielectric layers 760 and the lower metal interconnect structures 780 is herein referred to an underlying peripheral device region 700, which is located underneath a memory-level assembly to be subsequently formed and includes peripheral devices for the memory-level assembly. The lower metal interconnect structures 780 are embedded in the lower level dielectric layers 760.

The lower metal interconnect structures 780 can be electrically shorted to active nodes (e.g., transistor active regions 742 or gate electrodes 750) of the semiconductor devices 710 (e.g., CMOS devices), and are located at the level of the lower level dielectric layers 760. Only a subset of the active nodes is illustrated in FIG. 1 for clarity. Through-stack contact via structures (not shown in FIG. 1) can be subsequently formed directly on the lower metal interconnect structures 780 to provide electrical connection to memory devices to be subsequently formed. In one embodiment, the pattern of the lower metal interconnect structures 780 can be selected such that the topmost lower metal line structures 788 (which are a subset of the lower metal interconnect structures 780 located at the topmost portion of the lower metal interconnect structures 780) can provide landing pad structures for the through-stack contact via structures to be subsequently formed.

Figure 2:
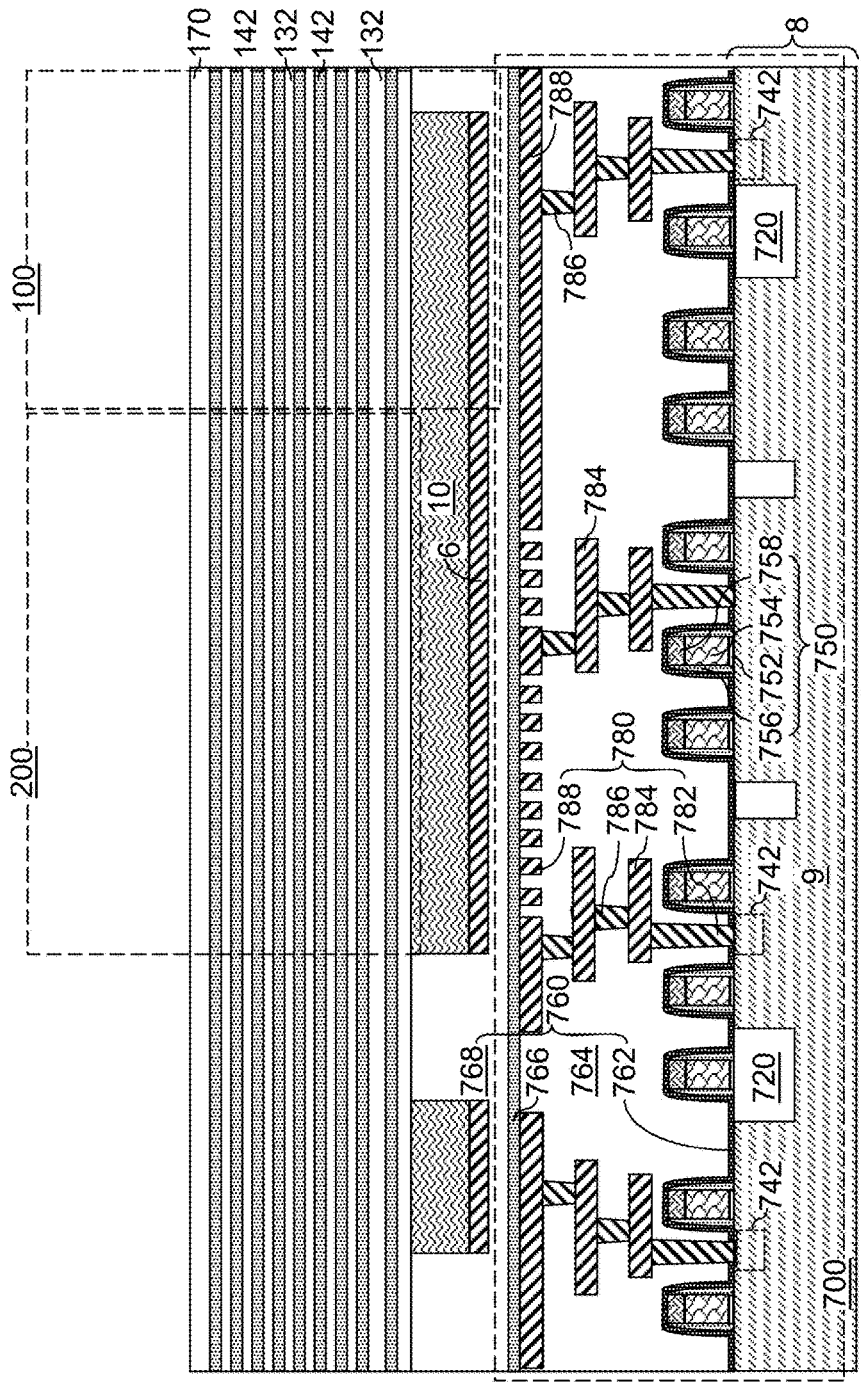
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack can include first insulting layers 132 as the first material layers, and first spacer material layers as the second material layers. In one embodiment, the first spacer material layers can be sacrificial material layers that are subsequently replaced with electrically conductive layers. In another embodiment, the first spacer material layers can be electrically conductive layers that are not subsequently replaced with other layers. While the present disclosure is described employing embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the planar semiconductor material layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can be material layers that comprise silicon nitride.

In one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first-tier alternating stack (132, 142) can have a uniform thickness that is substantially invariant within each respective first sacrificial material layer 142.

A first insulating cap layer 170 is subsequently formed over the stack (132, 142). The first insulating cap layer 170 includes a dielectric material, which can be any dielectric material that can be employed for the first insulating layers 132. In one embodiment, the first insulating cap layer 170 includes the same dielectric material as the first insulating layers 132. The thickness of the insulating cap layer 170 can be in a range from 20 nm to 300 nm, although lesser and greater thicknesses can also be employed.

Figure 3:
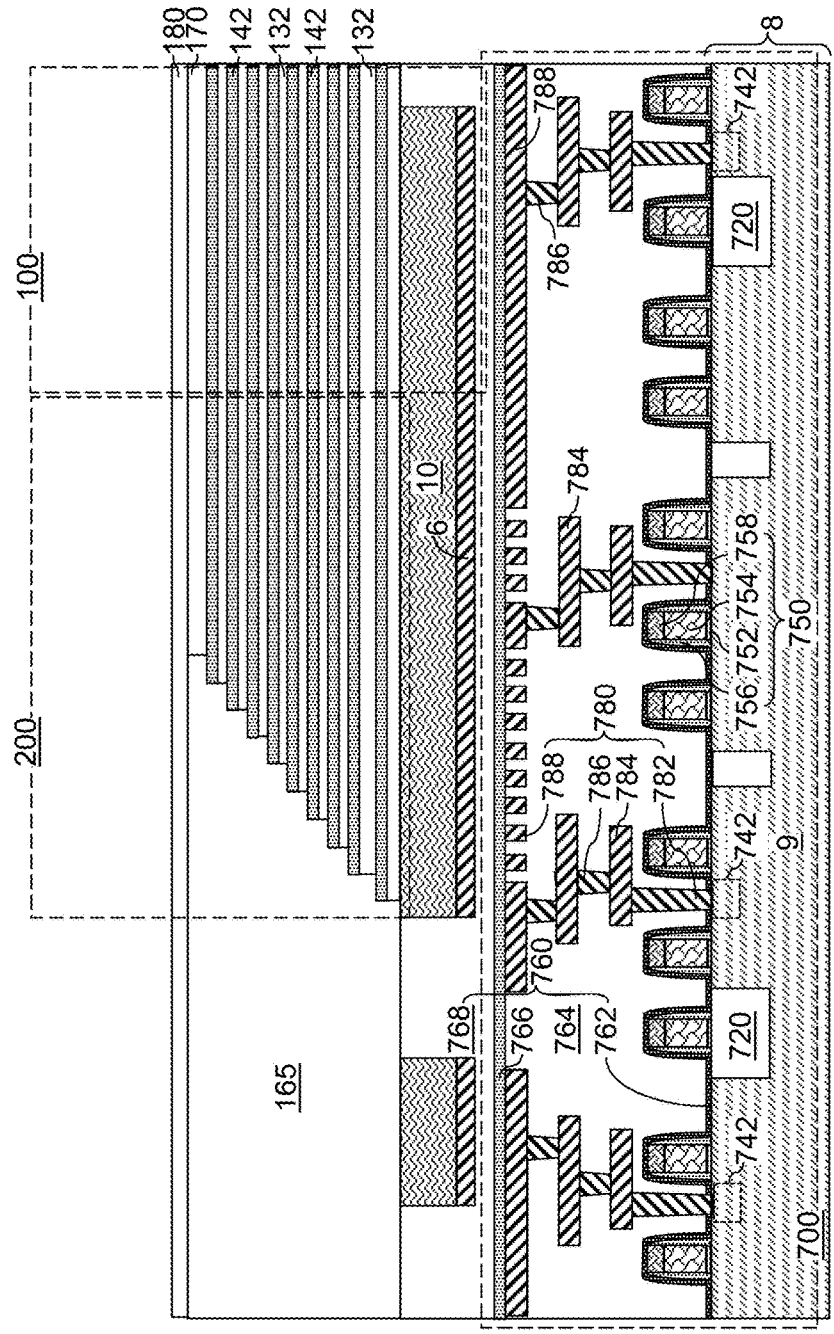
FIG. 3 is a vertical cross-sectional view of the exemplary structure after patterning first-tier staircase regions on the first-tier alternating stack and forming a first-tier retro-stepped dielectric material portion according to an embodiment of the present disclosure.

Referring to FIG. 3, the first insulating cap layer 170 and the first-tier alternating stack (132, 142) can be patterned to form first stepped surfaces in the word line contact region 200. The word line word line contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. A dielectric material can be deposited to fill the first stepped cavity to form a first-tier retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first-tier retro-stepped dielectric material portion 165 collectively constitute a first-tier structure, which is an in-process structure that is subsequently modified.

Figure 4A:
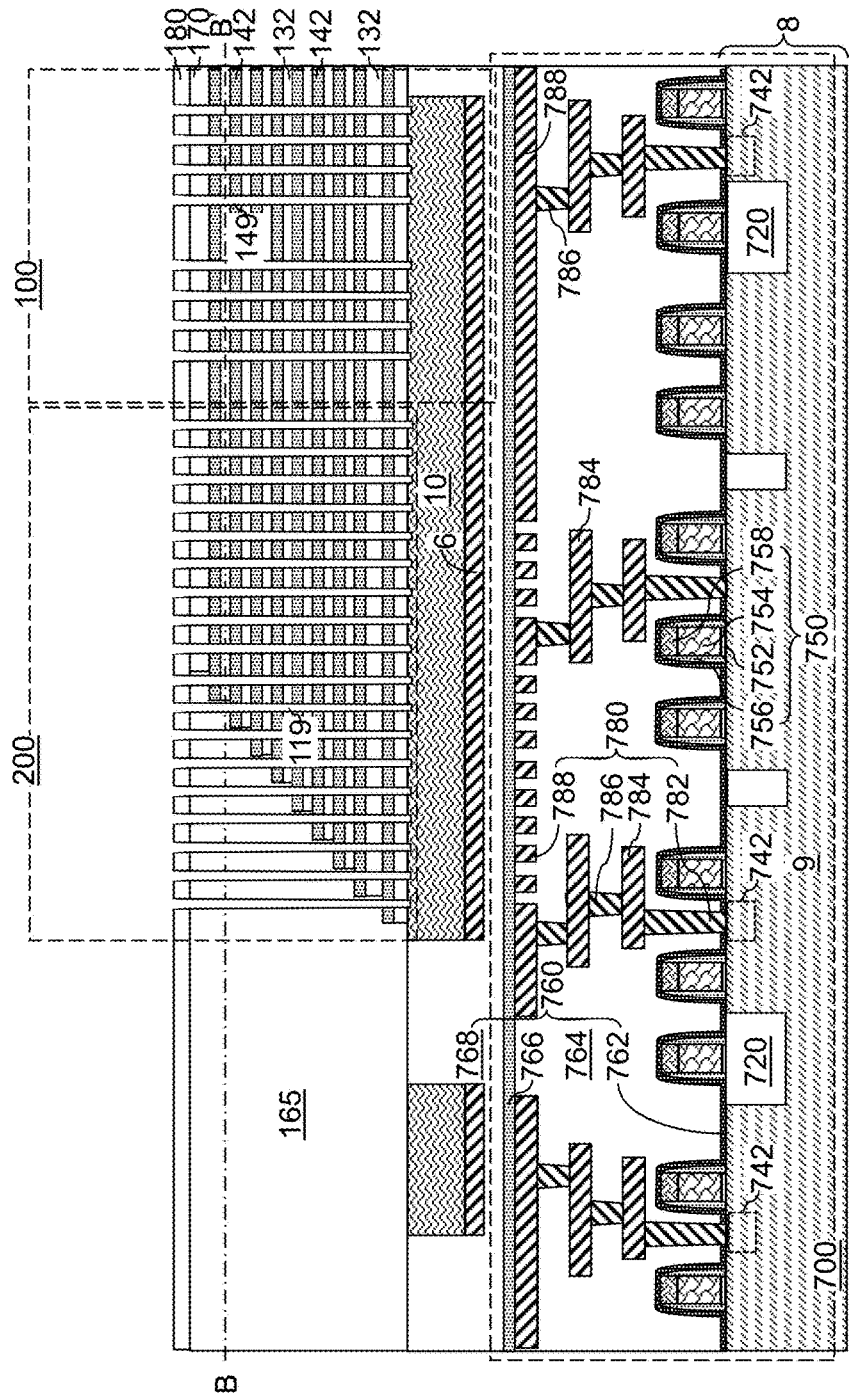
FIG. 4A is a vertical cross-sectional view of the exemplary structure after formation of first-tier memory openings and first-tier support openings according to an embodiment of the present disclosure.

Referring to FIGS. 4A and 4B, an inter-tier dielectric layer 180 may be optionally deposited over the first-tier structure (132, 142, 165, 170). The inter-tier dielectric layer 180 includes a dielectric material such as silicon oxide. The thickness of the inter-tier dielectric layer 180 can be in a range from 30 nm to 300 nm, although lesser and greater thicknesses can also be employed. Locations of steps S in the first-tier alternating stack (132, 142) are illustrated as dotted lines.

First-tier memory openings 149 and first-tier support openings 119 can be formed. The first-tier memory openings 149 and the first-tier support openings 119 extend through the first-tier alternating stack (132, 142) at least to a top surface of the planar semiconductor material layer 10. The first-tier memory openings 149 can be formed in the memory array region 100 at locations at which memory stack structures including vertical stacks of memory elements are to be subsequently formed. The first-tier support openings 119 can be formed in the word line word line contact region 200. For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first-tier alternating stack (132, 142) by at least one anisotropic etch that employs the patterned lithographic material stack as an etch mask. Portions of the first insulating cap layer 170 (and the optional inter-tier dielectric layer 180), and the first-tier alternating stack (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first-tier alternating stack (132, 142) forms the first-tier memory openings 149 and the first-tier support openings 119.

In one embodiment, the chemistry of the anisotropic etch process employed to etch through the materials of the first-tier alternating stack (132, 142) can alternate to optimize etching of the first and second materials in the first-tier alternating stack (132, 142). The anisotropic etch can be, for example, a series of reactive ion etches or a single etch (e.g., $CF_4/O_2/Ar$ etch). The sidewalls of the first-tier memory openings 149 and the support openings 119 can be substantially vertical, or can be tapered. Subsequently, the patterned lithographic material stack can be subsequently removed, for example, by ashing.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first insulating layers 132 (that can include undoped silicate glass), an isotropic etch (such as a wet etch employing HF) can be employed to expand the lateral dimensions of the first-tier memory openings at the level of the inter-tier dielectric layer 180. The portions of the first-tier memory openings 149 (and the first-tier support openings 119) located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
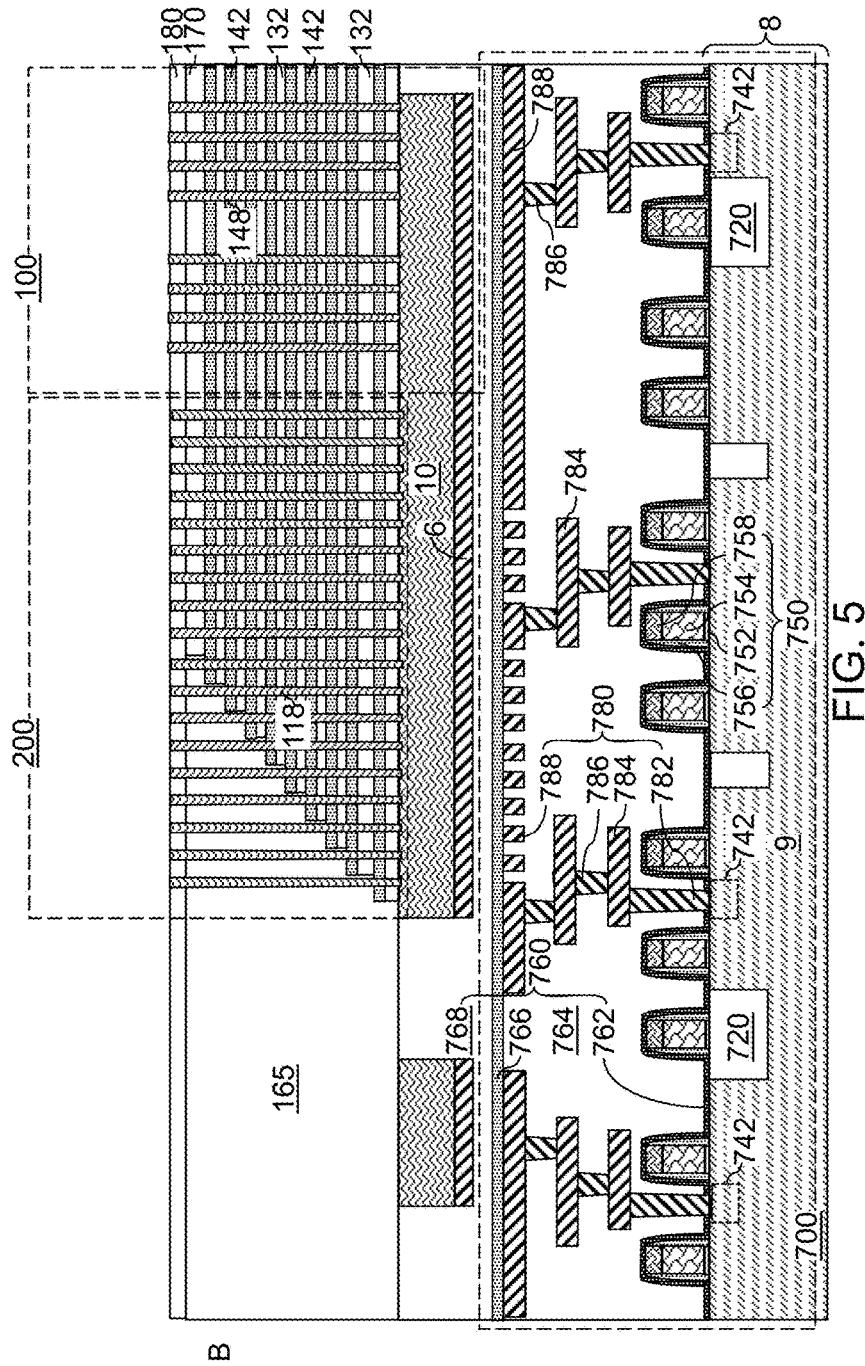
FIG. 5 is a vertical cross-sectional view of the exemplary structure after formation of sacrificial memory opening fill portions and sacrificial support opening fill portions according to an embodiment of the present disclosure.

Referring to FIG. 5, sacrificial memory opening fill portions 148 can be formed in the first-tier memory openings 149, and sacrificial support opening fill portions 118 can be formed in the first-tier support openings 119. For example, a sacrificial fill material layer is deposited in the first-tier memory openings 149 and the first-tier support openings 119. The sacrificial fill material layer includes a sacrificial material which can be subsequently removed selective to the materials of the first insulator layers 132 and the first sacrificial material layers 142. In one embodiment, the sacrificial fill material layer can include germanium, a silicon-germanium alloy, carbon, borosilicate glass (which provides higher etch rate relative to undoped silicate glass), porous or non-porous organosilicate glass, organic polymer, inorganic polymer or amorphous silicon (if semiconductor material layer 10 is a polysilicon layer and/or if a sacrificial dielectric liner is formed in the openings first). Optionally, a thin etch stop layer (such as a silicon oxide layer having a thickness in a range from 1 nm to 3 nm) may be employed prior to depositing the sacrificial fill material layer. The sacrificial fill material layer may be formed by a non-conformal deposition or a conformal deposition method.

Portions of the deposited sacrificial material can be removed from above the first insulating cap layer 170 (and the optional inter-tier dielectric layer 180, if present). For example, the sacrificial fill material layer can be recessed to a top surface of the first insulating cap layer 170 (and the optional inter-tier dielectric layer 180) employing a planarization process. The planarization process can include a recess etch, chemical mechanical planarization (CMP), or a combination thereof. The top surface of the first insulating layer 170 (and optionally layer 180 if present) can be employed as an etch stop layer or a planarization stop layer. Each remaining portion of the sacrificial material in a first-tier memory opening 149 constitutes a sacrificial memory opening fill portion 148. Each remaining portion of the sacrificial material in a first-tier support opening 119 constitutes a sacrificial support opening fill portion 118. The top surfaces of the sacrificial memory opening fill portions 148 and the sacrificial support opening fill portions 118 can be coplanar with the top surface of the inter-tier dielectric layer 180 (or the first insulating cap layer 170 if the inter-tier dielectric layer 180 is not present). The sacrificial memory opening fill portion 148 and the sacrificial support opening fill portions 118 may, or may not, include cavities therein.

Figure 6:
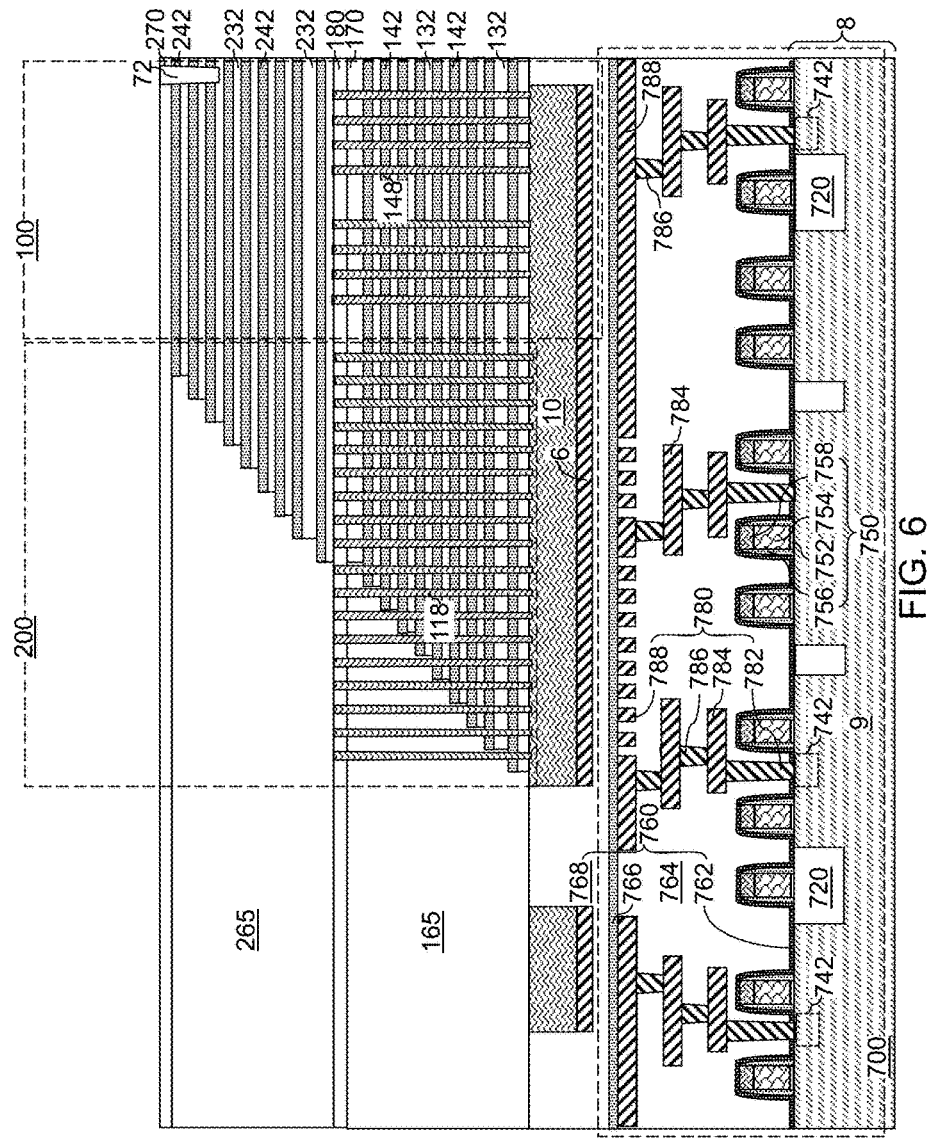
FIG. 6 is a vertical cross-sectional view of the exemplary structure after formation of a second-tier alternating stack of second insulating layers and second spacer material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional alternating stack of insulating layers and spacer material layers, which can be sacrificial material layers. For example, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces in the second stepped area can be formed in the word line word line contact region 200 employing a same set of processing steps as the processing steps employed to form the first stepped surfaces in the first stepped area with suitable adjustment to the pattern of at least one masking layer. A second-tier retro-stepped dielectric material portion 265 can be formed over the second stepped surfaces in the word line word line contact region 200.

A second insulating cap layer 270 can be subsequently formed over the second alternating stack (232, 242). The second insulating cap layer 270 includes a dielectric material that is different from the material of the second sacrificial material layers 242. In one embodiment, the second insulating cap layer 270 can include silicon oxide. In one embodiment, the first and second sacrificial material layers (142, 242) can comprise silicon nitride.

Generally speaking, at least one alternating stack of insulating layers (132, 232) and spacer material layers (such as sacrificial material layers (142, 242)) can be formed over the planar semiconductor material layer 10, and at least one retro-stepped dielectric material portion (165, 265) can be formed over the staircase regions on the at least one alternating stack (132, 142, 232, 242).

Optionally, drain-select-level shallow trench isolation structures 72 can be formed through a subset of layers in an upper portion of the second-tier alternating stack (232, 242). The second sacrificial material layers 242 that are cut by the select-drain-level shallow trench isolation structures 72 correspond to the levels in which drain-select-level electrically conductive layers are subsequently formed. The drain-select-level shallow trench isolation structures 72 include a dielectric material such as silicon oxide.

Figure 7A:
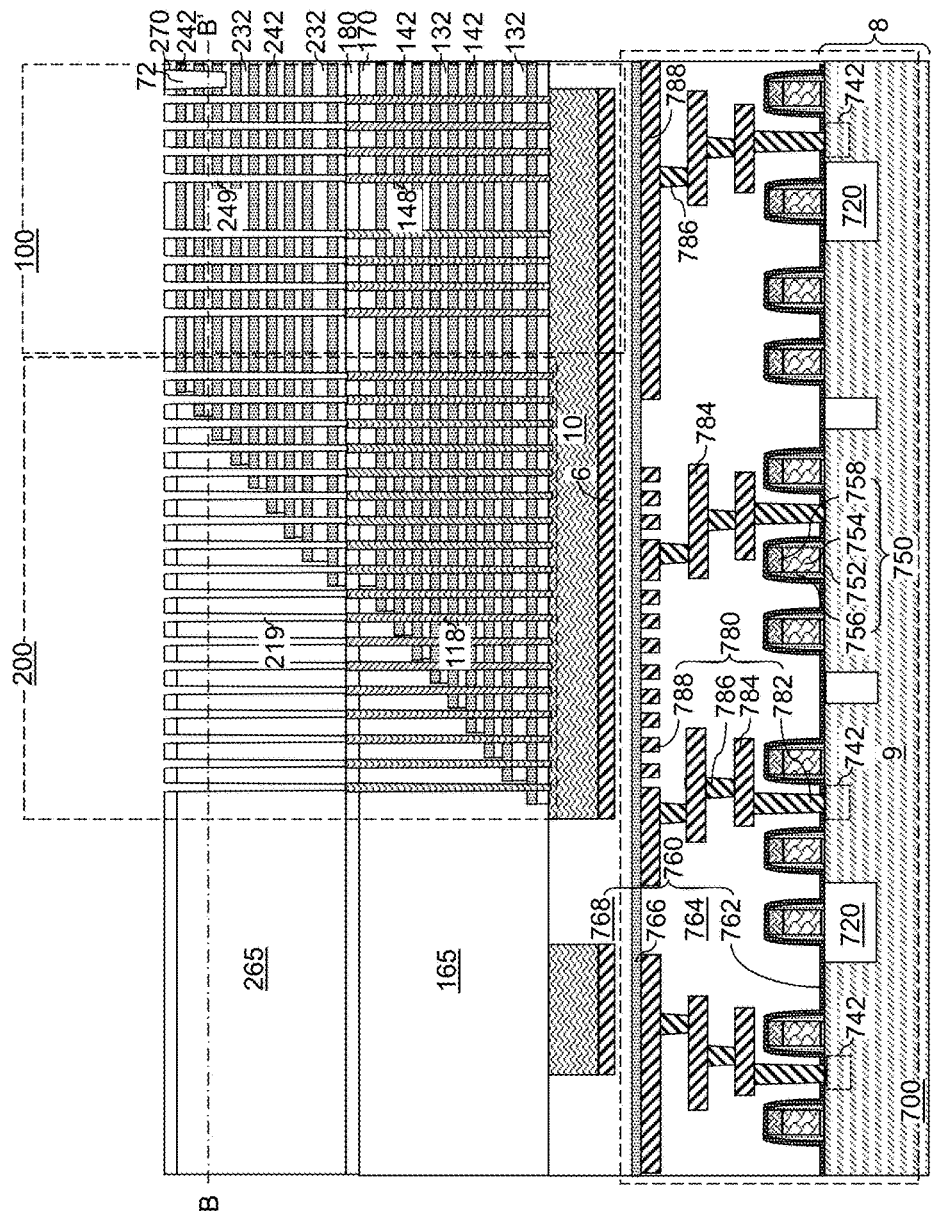
FIG. 7A is a vertical cross-sectional view of the exemplary structure after formation of inter-tier memory openings and inter-tier support openings according to an embodiment of the present disclosure.

Referring to FIGS. 7A and 7B, second-tier memory openings 249 and second-tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the sacrificial support opening fill portions 118, i.e., the pattern of the first-tier memory openings 149 and the first-tier support openings 119. Thus, the lithographic mask employed to pattern the first-tier memory openings 149 and the first-tier support openings 119 can be employed to pattern the second-tier memory openings 249 and the second-tier support openings 219. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second-tier alternating stack (232, 242) can alternate to optimize etching of the alternating material layers in the second-tier alternating stack (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying sacrificial support opening fill portion 118 can be physically exposed at the bottom of each second-tier support opening 219. After the top surfaces of the sacrificial memory opening fill portions 148 and the sacrificial support opening fill portions 118 are physically exposed, an etch process can be performed, which removes the sacrificial material of the sacrificial memory opening fill portions 148 and the sacrificial support opening fill portions 118 selective to the materials of the second-tier alternating stack (232, 242) and the first-tier alternating stack (132, 142) (e.g., $C_4F_8/O_2$/Ar etch).

Upon removal of the sacrificial memory opening fill portions 148, each vertically adjoining pair of a second-tier memory opening 249 and a first-tier memory opening 149 forms a continuous cavity that extends through the first-tier alternating stack (132, 142) and the second-tier alternating stack (232, 242). Likewise, upon removal of the sacrificial support opening fill portions 118, each vertically adjoining pair of a second-tier support opening 219 and a first-tier support opening 119 forms a continuous cavity that extends through the first-tier alternating stack (132, 142) and the second-tier alternating stack (232, 242). The continuous cavities are herein referred to as memory openings (or inter-tier memory openings) and support openings (or inter-tier support openings), respectively. A top surface of the planar semiconductor material layer 10 can be physically exposed at the bottom of each memory opening and at the bottom of each support openings. Locations of steps S in the first-tier alternating stack (132, 142) and the second-tier alternating stack (232, 242) are illustrated as dotted lines.

Figure 8:
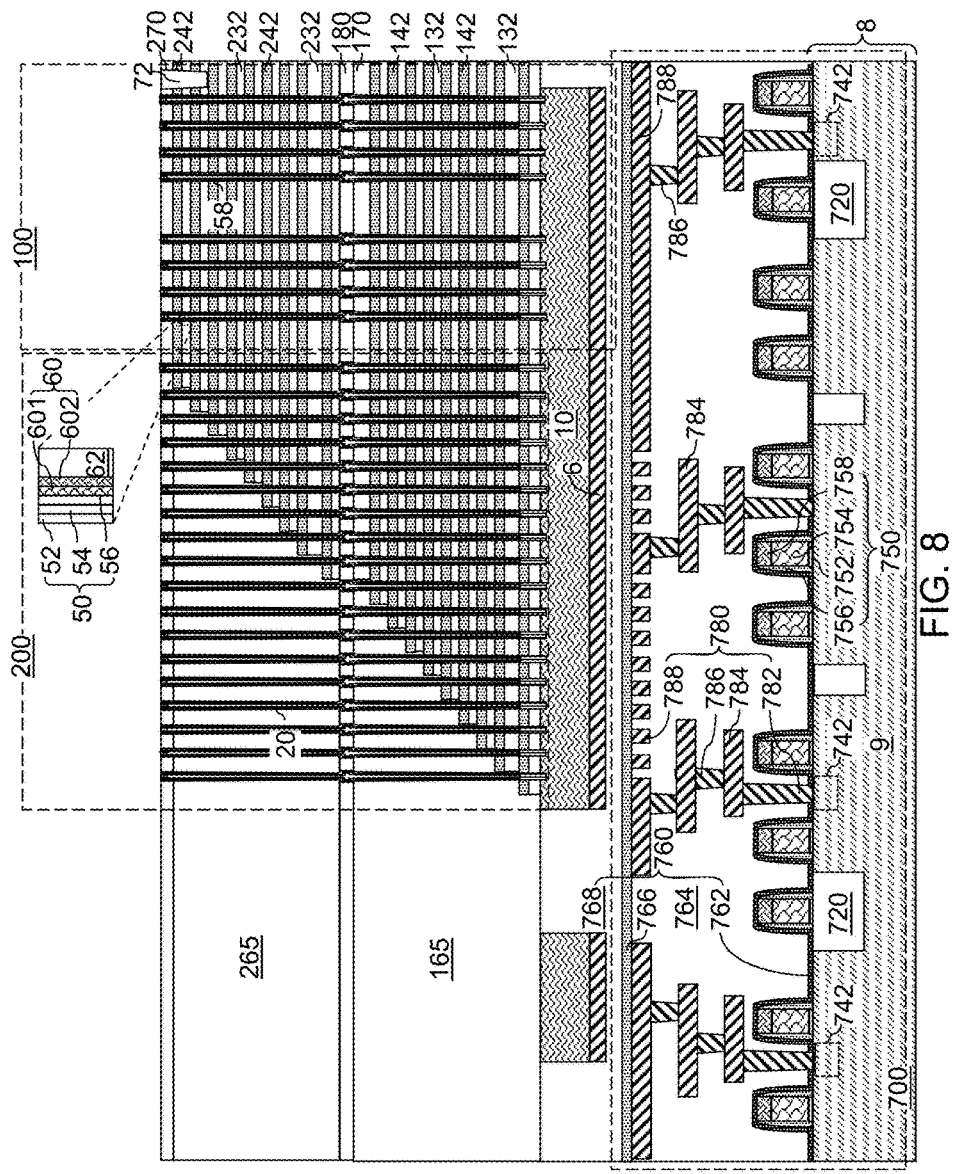
FIG. 8 is a vertical cross-sectional view of the exemplary structure after formation of memory stack structures according to an embodiment of the present disclosure.

Referring to FIG. 8, memory opening fill structures 58 are formed within each memory opening, and support pillar structures 20 are formed within each support opening. The memory opening fill structures 58 and the support pillar structures 20 can include a same set of components, and can be formed simultaneously.

FIGS. 9A-9H provide sequential cross-sectional views of a memory opening 49 or a support opening (119, 219) during formation of a memory opening fill structure 58 or a support pillar structure 20. While a structural change in a memory opening 49 is illustrated in FIGS. 9A-9H, it is understood that the same structural change occurs in each memory openings 49 and in each of the support openings (119, 219) during the same set of processing steps.

Figure 9A:
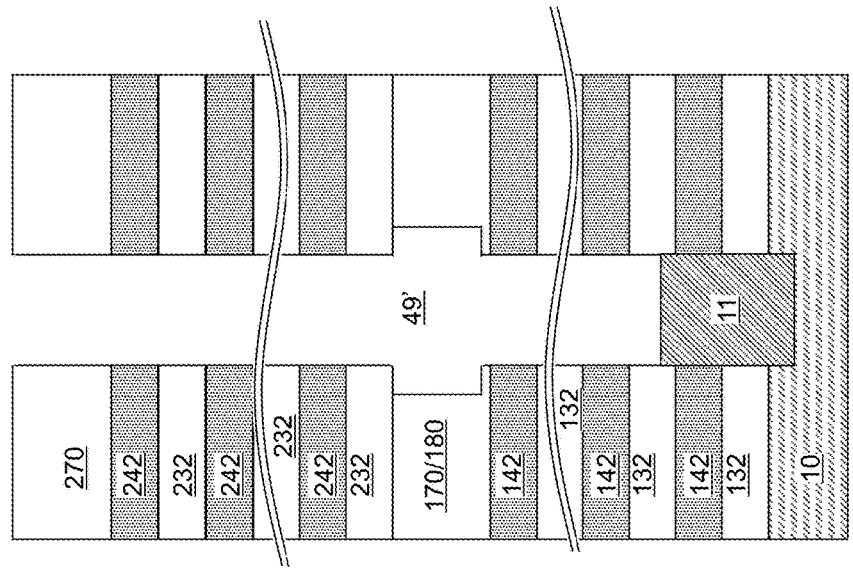

Referring to FIG. 9A, a memory opening 49 in the exemplary device structure of FIG. 12 is illustrated. The memory opening 49 extends through the first-tier structure and the second-tier structure. Likewise, each support opening (119, 219) extends through the first-tier structure and the second-tier structure.

Figure 9B:
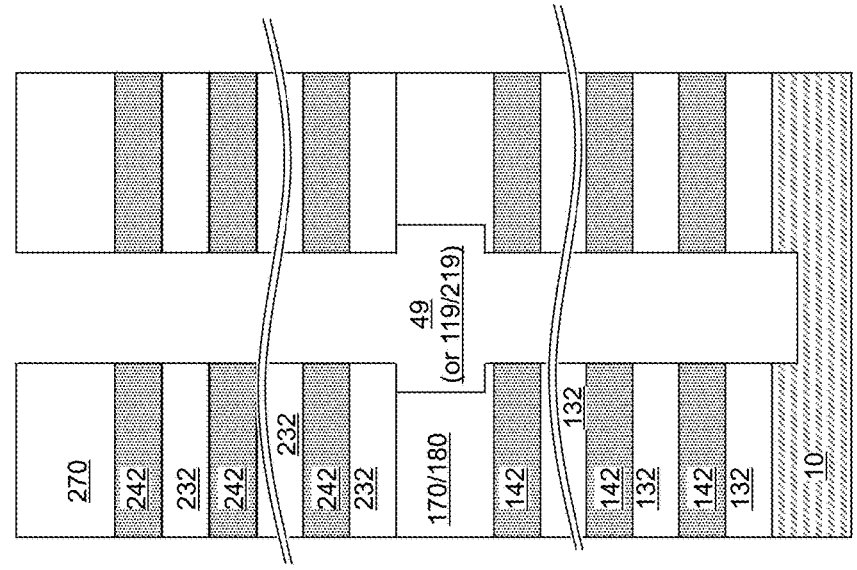

Referring to FIG. 9B, an optional pedestal channel portion (e.g., an epitaxial pedestal) 11 can be formed at the bottom portion of each memory opening 49 and each support openings (119, 219), for example, by a selective semiconductor deposition process. In one embodiment, the pedestal channel portion 11 can be doped with electrical dopants of the same conductivity type as the planar semiconductor material layer 10. In one embodiment, at least one source select gate electrode can be subsequently formed by replacing each sacrificial material layer 42 located below the horizontal plane including the top surfaces of the pedestal channel portions 11 with a respective conductive material layer. A cavity 49' is present in the unfilled portion of the memory opening 49 (or of the support opening) above the pedestal channel portion 11. In one embodiment, the pedestal channel portion 11 can comprise single crystalline silicon. In one embodiment, the pedestal channel portion 11 can have a doping of the same as the conductivity type of the planar semiconductor material layer 10.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the planar semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9H:
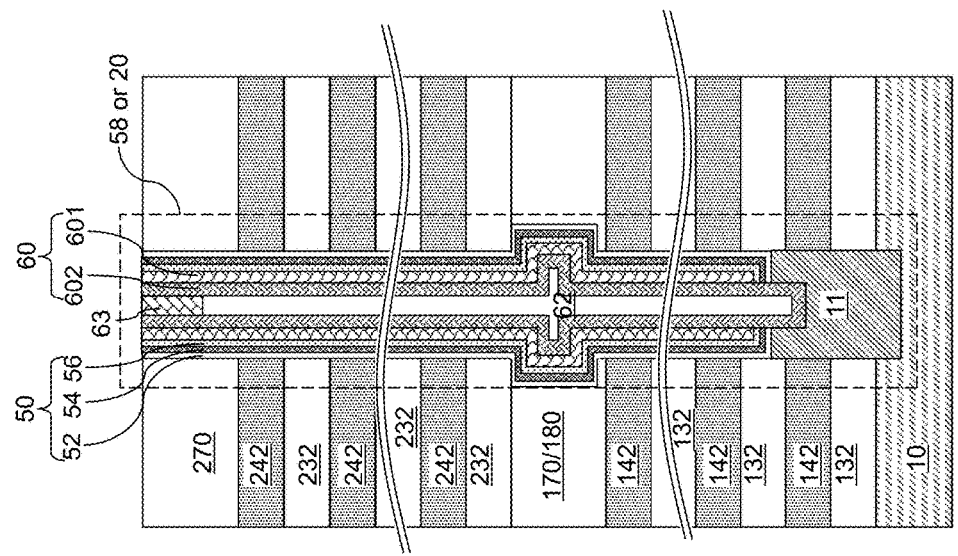
Figure 9G:
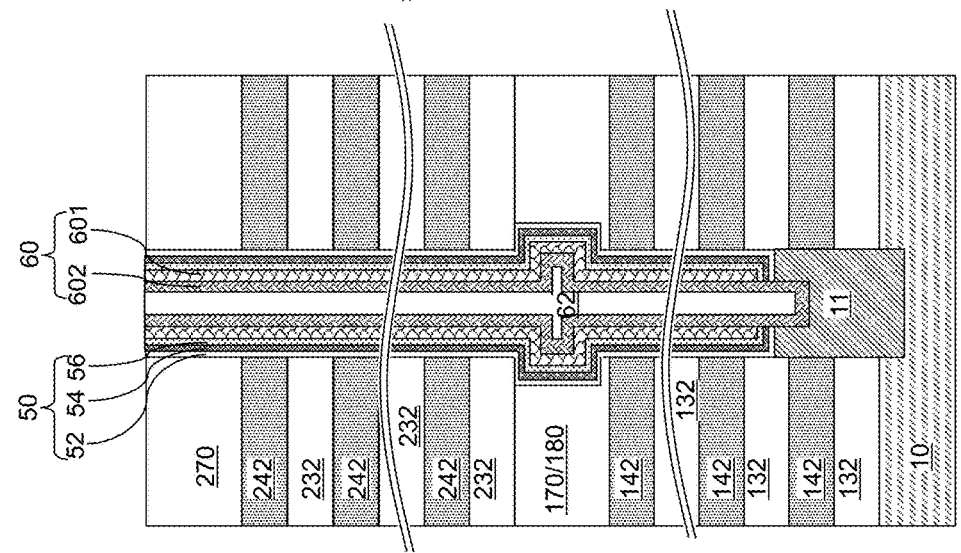

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening (119, 219).

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening (119, 219) fills the respective support openings (119, 219), and constitutes a support pillar structure 20.

The first-tier structure (132, 142, 170, 165), the second-tier structure (232, 242, 270, 265), the inter-tier dielectric layer 180, the memory opening fill structures 58, and the support pillar structures 20 collectively constitute a memory-level assembly. The memory-level assembly is formed over the planar semiconductor material layer 10 such that the planar semiconductor material layer 10 includes horizontal semiconductor channels electrically connected to vertical semiconductor channels 60 within the memory stack structures 55.

Figure 10A:
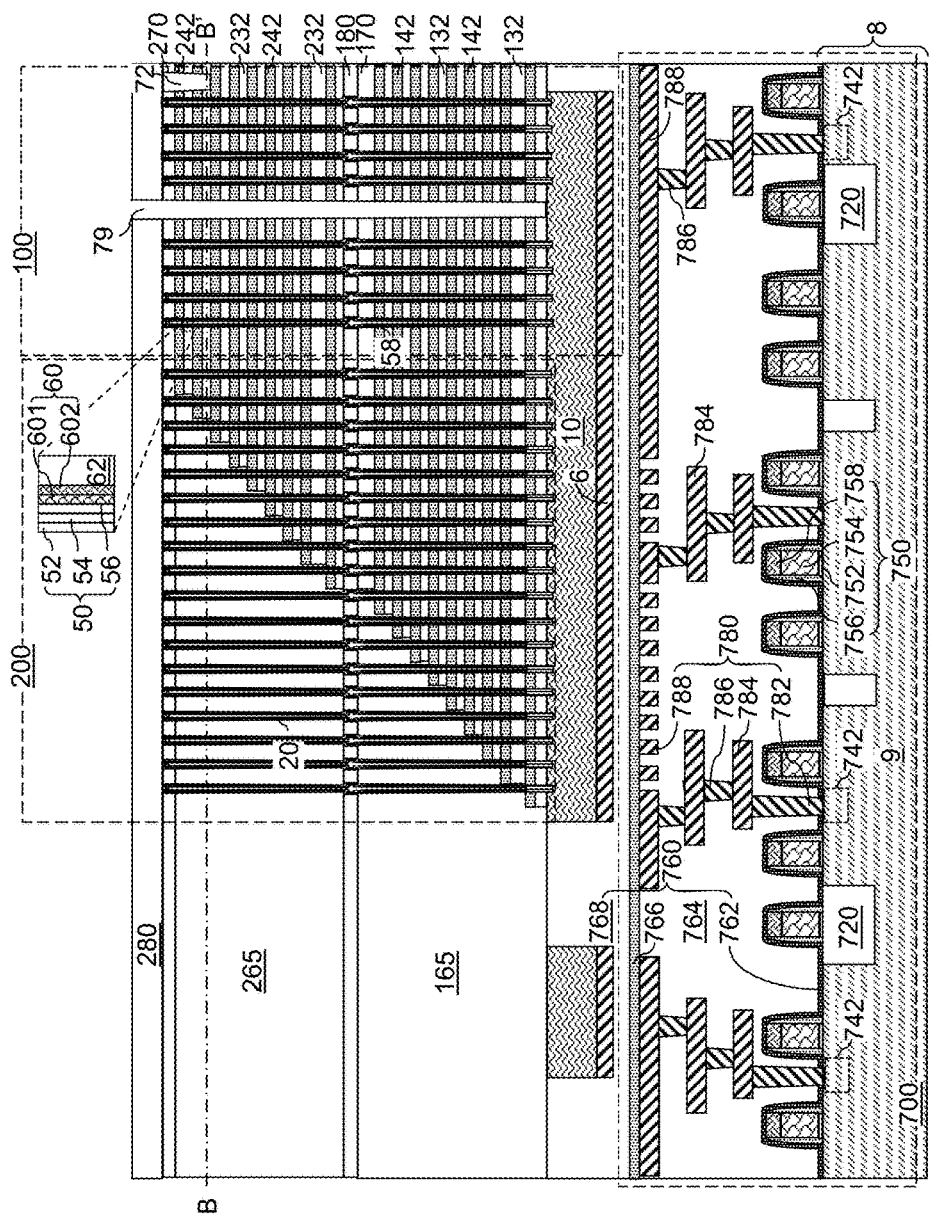
FIG. 10A is a vertical cross-sectional view of the exemplary structure after formation of backside contact trenches according to an embodiment of the present disclosure.

Referring to FIGS. 10A and 10B, a first contact level dielectric layer 280 can be formed over the memory-level assembly. The first contact level dielectric layer 280 is formed at a contact level through which various contact via structures are subsequently formed to the drain regions 63 and the various electrically conductive layers that replaces the sacrificial material layers (142, 242) in subsequent processing steps.

Backside contact trenches 79 are subsequently formed through the first contact level dielectric layer 280 and the memory-level assembly. For example, a photoresist layer can be applied and lithographically patterned over the first contact level dielectric layer 280 to form elongated openings that extend along a first horizontal direction hd1. An anisotropic etch is performed to transfer the pattern in the patterned photoresist layer through the first contact level dielectric layer 280 and the memory-level assembly to a top surface of the planar semiconductor material layer 10. The photoresist layer can be subsequently removed, for example, by ashing.

The backside contact trenches 79 extend along the first horizontal direction hd1, and thus, are elongated along the first horizontal direction hd1. The backside contact trenches 79 can be laterally spaced among one another along a second horizontal direction hd2, which can be perpendicular to the first horizontal direction hd1. The backside contact trenches 79 can extend through the memory array region (e.g., a memory plane) 100 and the word line word line contact region 200. The first subset of the backside contact trenches 79 laterally divides the memory-level assembly (e.g., into memory blocks).

Figure 11A:
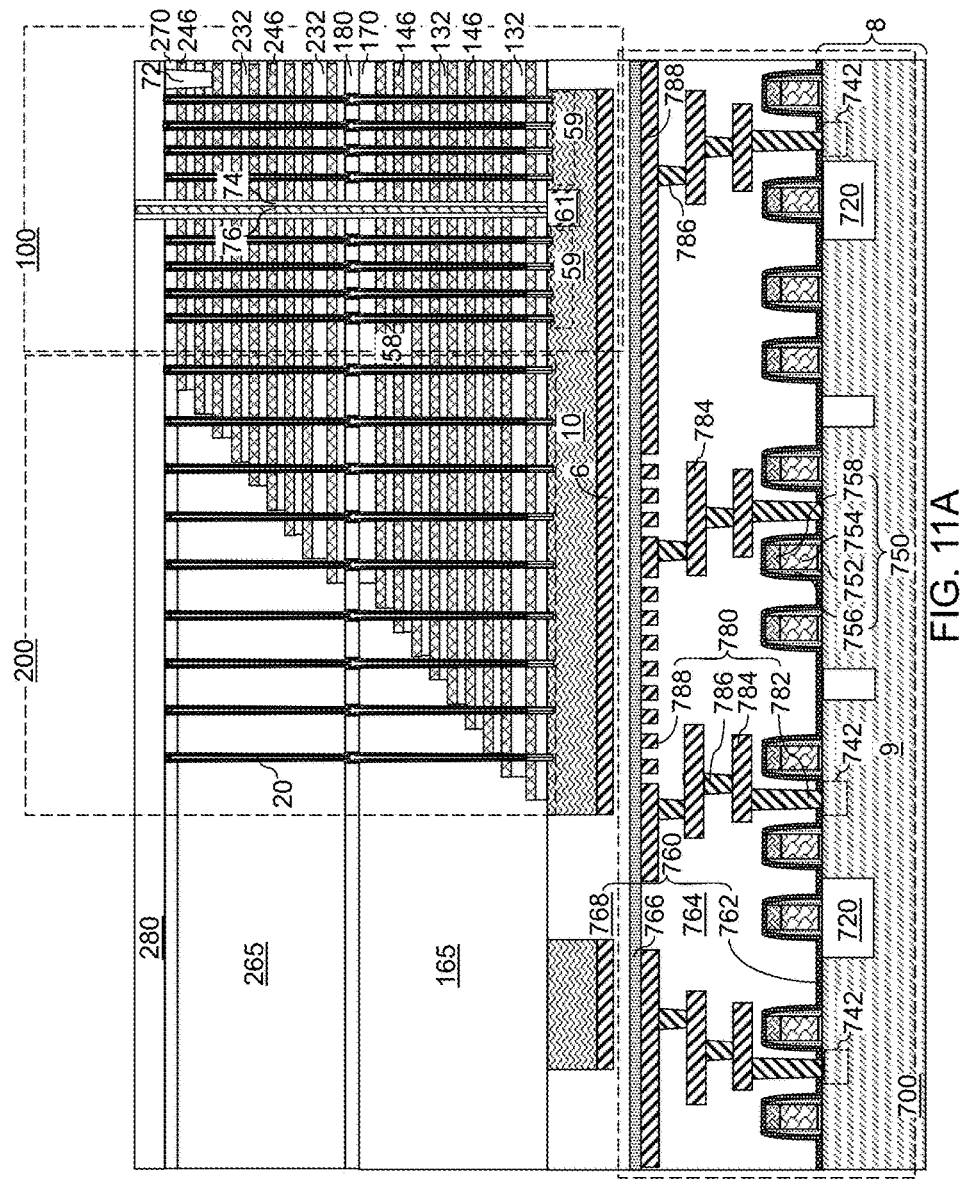
FIG. 11A is a vertical cross-sectional view of the exemplary structure after replacement of sacrificial material layers with electrically conductive layers and formation of insulating spacers and backside contact via structures according to an embodiment of the present disclosure.
Figure 11B:
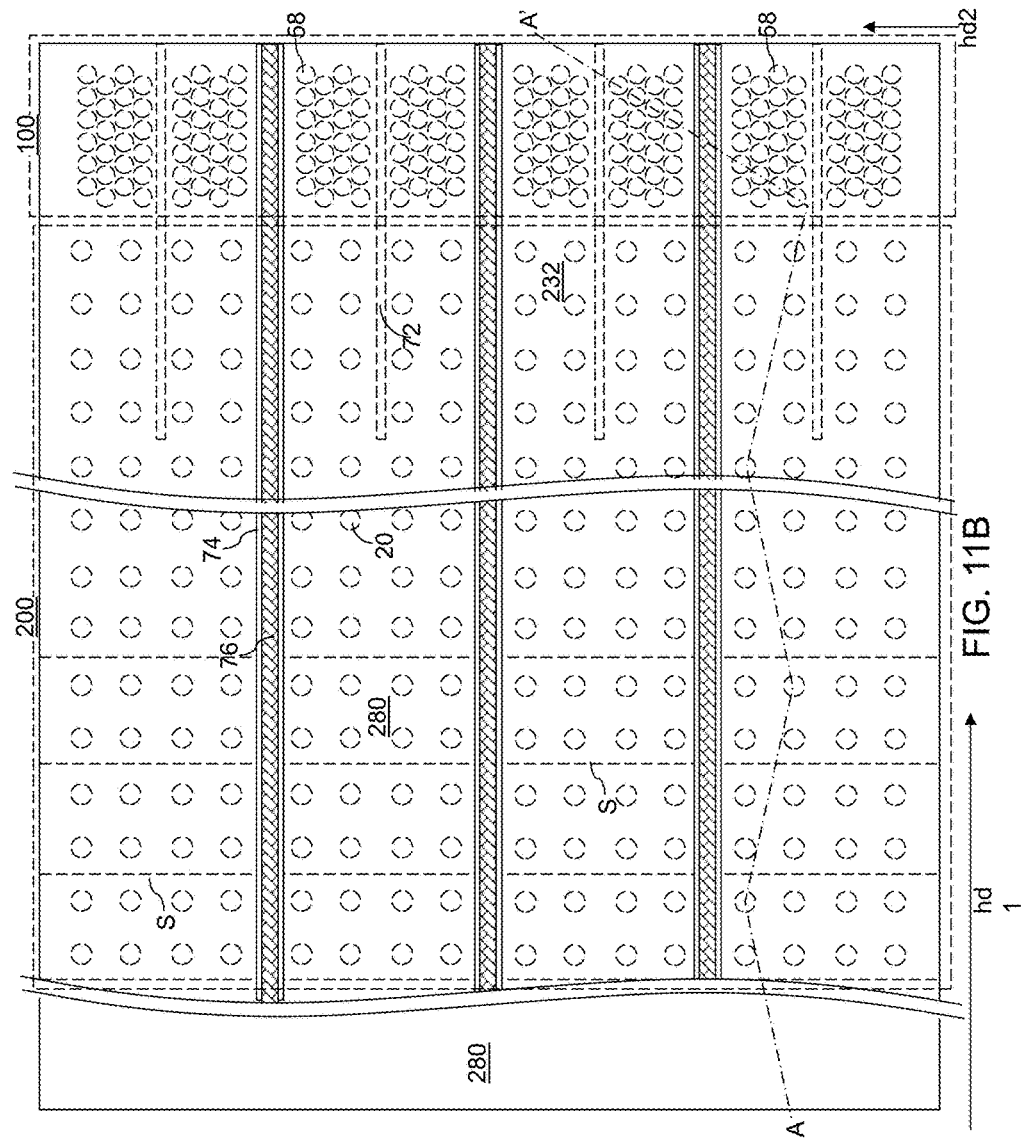
FIG. 11B is a horizontal cross-sectional view of the exemplary structure along the horizontal plane B-B' in FIG. 11A. The zig-zag vertical plane A-A' corresponds to the plane of the vertical cross-sectional view of FIG. 11A.

Referring to FIGS. 11A and 11B, an etchant that selectively etches the materials of the first and second sacrificial material layers (142, 242) with respect to the materials of the first and second insulating layers (132, 232), the first and second insulating cap layers (170, 270), and the material of the outermost layer of the memory films 50 can be introduced into the backside contact trenches 79, for example, employing an isotropic etch process. First backside recesses are formed in volumes from which the first sacrificial material layers 142 are removed. Second backside recesses are formed in volumes from which the second sacrificial material layers 242 are removed. In one embodiment, the first and second sacrificial material layers (142, 242) can include silicon nitride, and the materials of the first and second insulating layers (132, 232), can be silicon oxide. In another embodiment, the first and second sacrificial material layers (142, 242) can include a semiconductor material such as germanium or a silicon-germanium alloy, and the materials of the first and second insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside contact trench 79. For example, if the first and second sacrificial material layers (142, 242) include silicon nitride, the etch process can be a wet etch process in which the exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second sacrificial material layers (142, 242). Further, a top surface of the planar semiconductor material layer 10 can be physically exposed at the bottom of each backside contact trench 79. An annular dielectric spacer (not shown) can be formed around each pedestal channel portion 11 by oxidation of a physically exposed peripheral portion of the pedestal channel portions 11. Further, a semiconductor oxide portion (not shown) can be formed from each physically exposed surface portion of the planar semiconductor material layer 10 concurrently with formation of the annular dielectric spacers.

A backside blocking dielectric layer (not shown) can be optionally deposited in the backside recesses and the backside contact trenches 79 and over the first contact level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside contact trench 79, and over the first contact level dielectric layer 280. The at least one conductive material can include at least one metallic material, i.e., an electrically conductive material that includes at least one metallic element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside contact trench 79 and over the first contact level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside contact trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside contact trenches 79. Specifically, the deposited metallic material of the continuous metallic material layer can be etched back from the sidewalls of each backside contact trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level shallow trench isolation structures 72 constitutes drain select gate electrodes. A subset of the first electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The semiconductor devices in the underlying peripheral device region 700 can comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the at least one an alternating stack (132, 146, 232, 246) includes alternating layers of respective insulating layers (132 or 232) and respective electrically conductive layers (146 or 246). The at least one alternating stack (132, 146, 232, 246) comprises staircase regions that include terraces in which each underlying electrically conductive layer (146, 246) extends farther along the first horizontal direction hd1 than any overlying electrically conductive layer (146, 246) in the memory-level assembly.

Dopants of a second conductivity type, which is the opposite of the first conductivity type of the planar semiconductor material layer 10, can be implanted into a surface portion of the planar semiconductor material layer 10 to form a source region 61 underneath the bottom surface of each backside contact trench 79. An insulating spacer 74 including a dielectric material can be formed at the periphery of each backside contact trench 79, for example, by deposition of a conformal insulating material (such as silicon oxide) and a subsequent anisotropic etch. The first contact level dielectric layer 280 may be thinned due to a collateral etch during the anisotropic etch that removes the vertical portions of horizontal portions of the deposited conformal insulating material.

A conformal insulating material layer can be deposited in the backside contact trenches 79, and can be anisotropically etched to form insulating spacers 74. The insulating spacers 74 include an insulating material such as silicon oxide, silicon nitride, and/or a dielectric metal oxide. A cavity laterally extending along the first horizontal direction hd1 is present within each insulating spacer 74.

A backside contact via structure can be formed in the remaining volume of each backside contact trench 79, for example, by deposition of at least one conductive material and removal of excess portions of the deposited at least one conductive material from above a horizontal plane including the top surface of the first contact level dielectric layer 280 by a planarization process such as chemical mechanical planarization or a recess etch. The backside contact via structures are electrically insulated in all lateral directions, and is laterally elongated along the first horizontal direction hd1. As such, the backside contact via structures are herein referred to as laterally-elongated contact via structures 76. As used herein, a structure is "laterally elongated" if the maximum lateral dimension of the structure along a first horizontal direction is greater than the maximum lateral dimension of the structure along a second horizontal direction that is perpendicular to the first horizontal direction at least by a factor of 5.

Optionally, each laterally-elongated contact via structure 76 may include multiple backside contact via portions such as a lower backside contact via portion and an upper backside contact via portion. In an illustrative example, the lower backside contact via portion can include a doped semiconductor material (such as doped polysilicon), and can be formed by depositing the doped semiconductor material layer to fill the backside contact trenches 79 and removing the deposited doped semiconductor material from upper portions of the backside contact trenches 79. The upper backside contact via portion can include at least one metallic material (such as a combination of a TiN liner and a W fill material), and can be formed by depositing the at least one metallic material above the lower backside contact via portions, and removing an excess portion of the at least one metallic material from above the horizontal plane including the top surface of the first contact level dielectric layer 280. The first contact level dielectric layer 280 can be thinned and removed during a latter part of the planarization process, which may employ chemical mechanical planarization (CMP), a recess etch, or a combination thereof. Each laterally-elongated contact via structure 76 can be formed through the memory-level assembly and on a respective source region 61. The top surface of each laterally-elongated contact via structure 76 can located above a horizontal plane including the top surfaces of the memory stack structures 55.

Figure 12A:
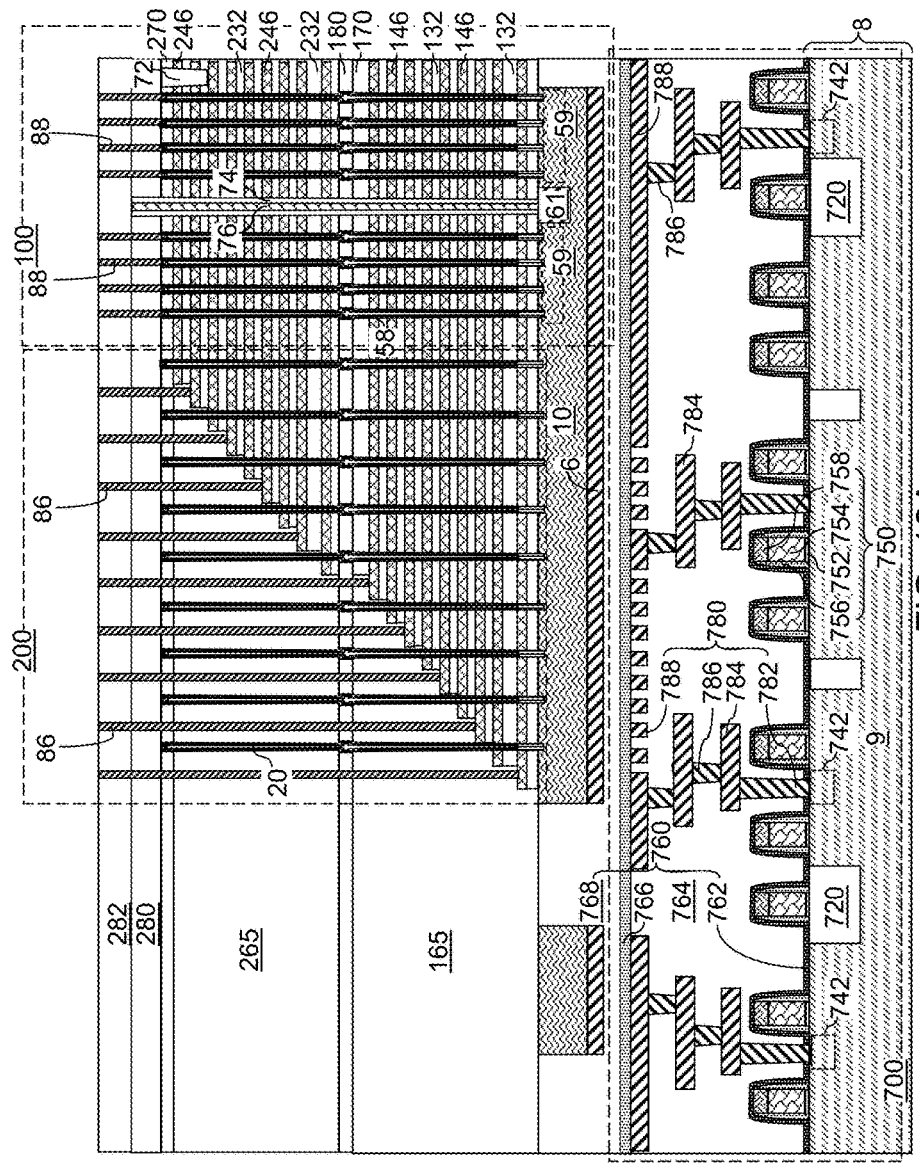
FIG. 12A is a vertical cross-sectional view of the exemplary structure after formation of drain contact via structures and word line contact via structures according to an embodiment of the present disclosure.
Figure 12B:
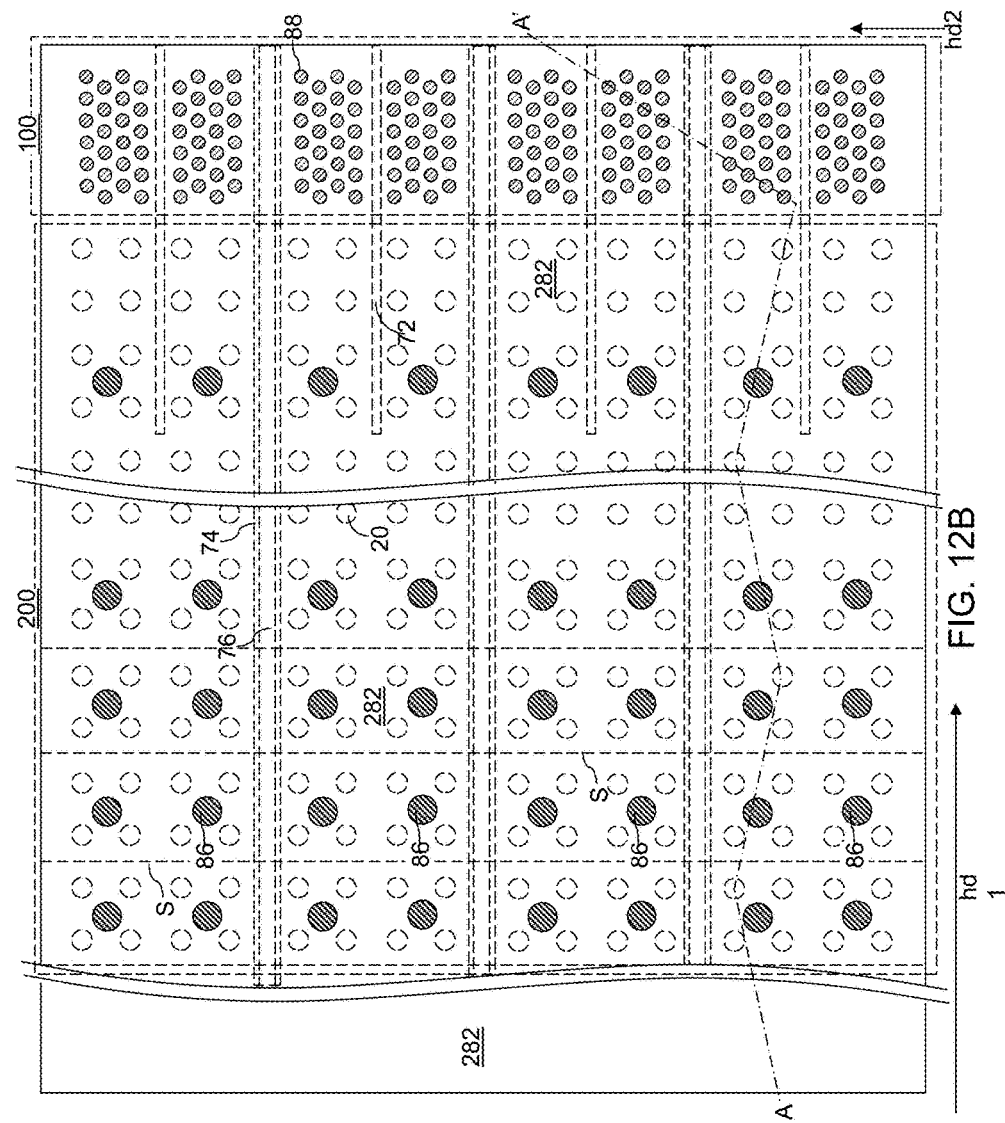
FIG. 12B is a horizontal cross-sectional view of the exemplary structure along the horizontal plane B-B' in FIG. 12A. The zig-zag vertical plane A-A' corresponds to the plane of the vertical cross-sectional view of FIG. 12A.

Referring to FIGS. 12A and 12B, a second contact level dielectric layer 282 can be optionally formed over the first contact level dielectric layer 280. The second contact level dielectric layer 282 includes a dielectric material such as silicon oxide or silicon nitride. The thickness of the second contact level dielectric layer 282 can be in a range from 30 nm to 300 nm, although lesser and greater thicknesses can also be employed.

Drain contact via structures 88 contacting the drain regions 63 can extend through the contact level dielectric layers (280, 282) and the second insulating cap layer 270 in the memory array region 100. A source connection via structure 91 can extend through the contact level dielectric layers (280, 282) to provide electrical connection to the laterally-elongated contact via structures 76.

Various contact via structures can be formed through the contact level dielectric layers (280, 282) and the retro-stepped dielectric material portions (165, 265). For example, word line contact via structures 86 can be formed in the word line word line contact region 200. A subset of the word line contact via structures 86 contacting the second electrically conductive layers 246 extends through the second-tier retro-stepped dielectric material portion 265 in the word line word line contact region 200, and does not extend through the first-tier retro-stepped dielectric material portion 165. Another subset of the word line contact via structures 86 contacting the first electrically conductive layers 146 extends through the second-tier retro-stepped dielectric material portion 265 and through the first-tier retro-stepped dielectric material portion 165 in the word line word line contact region 200.

Figure 13A:
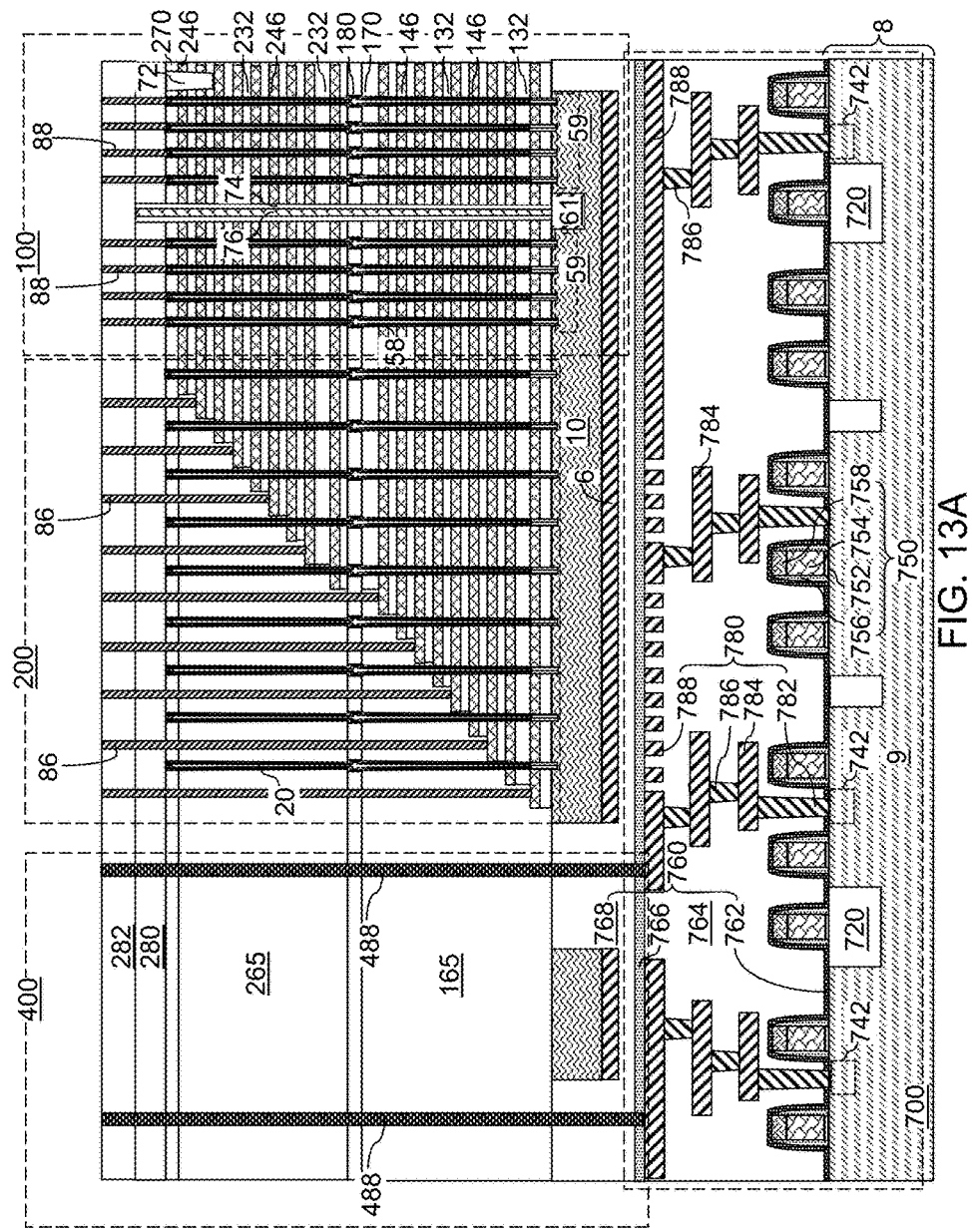
FIG. 13A is a vertical cross-sectional view of the exemplary structure after formation of through-stack contact via structures and through-dielectric contact via structures according to an embodiment of the present disclosure.
Figure 13B:
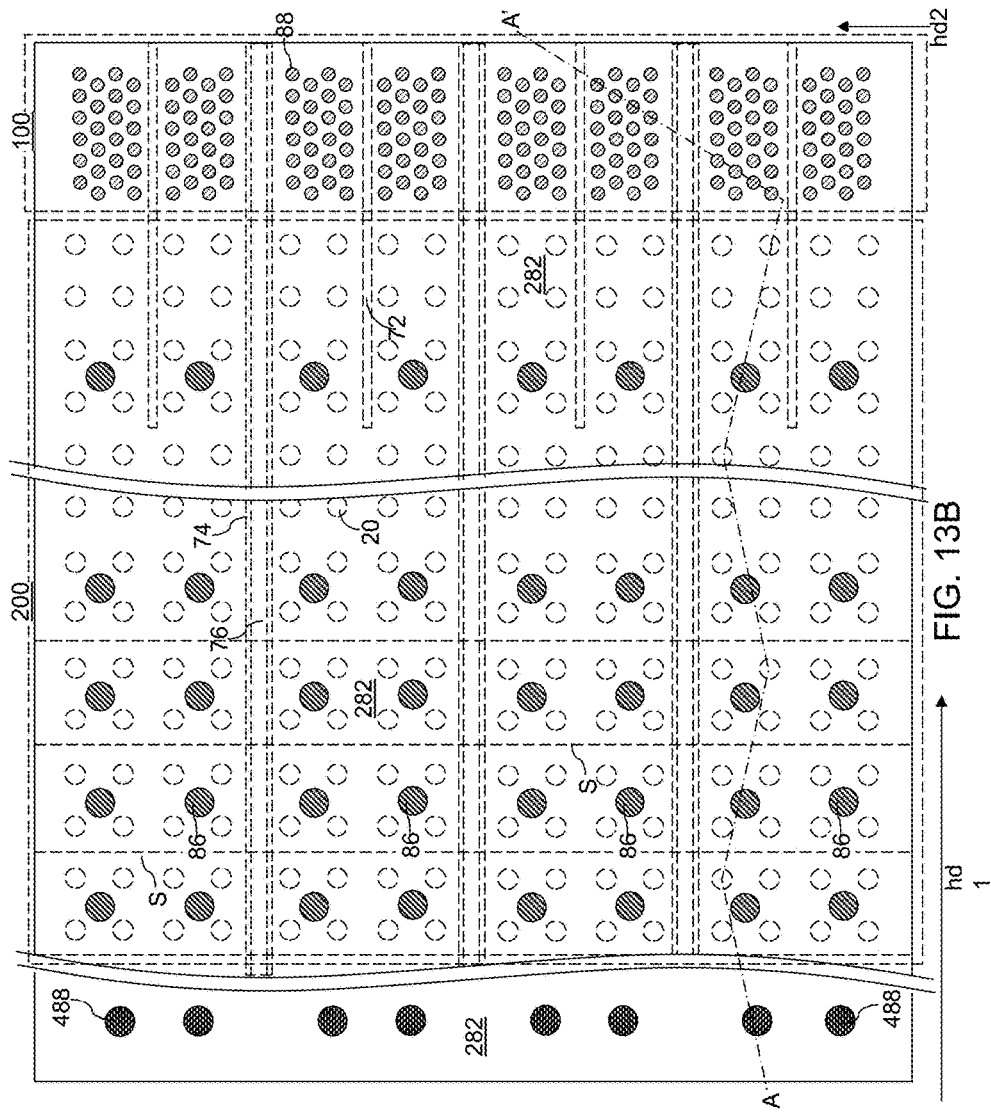
FIG. 13B is a horizontal cross-sectional view of the exemplary structure along the horizontal plane B-B' in FIG.

Referring to FIGS. 13A and 13B, a photoresist layer is applied over the second contact level dielectric layer 282, and is lithographically patterned to form openings in a peripheral region 400 located outside the memory array region 100 and the word line contact region 200. For example, the peripheral region 400 may surround memory array region 100 and/or the word line contact region 200 and/or may be located on one or more sides of the memory array region 100 and/or the word line contact region 200. In one embodiment, the areas of the openings may be within areas of openings in the planar semiconductor material layer 10 and the optional planar conductive material layer 6.

Through-dielectric via cavities are formed by an anisotropic etch process that transfers the pattern of the openings in the photoresist layer to the top surfaces of the topmost lower metal line structures 788. Specifically, the through-dielectric via cavities can be formed in the peripheral region 400 through the contact level dielectric layers (280, 282), the retro-stepped dielectric material portions (165, 265), the at least one second dielectric material layer 768, and the silicon nitride diffusion barrier layer 766 to a top surface of a respective one of the topmost lower metal liner structures 788. In one embodiment, the through-dielectric via cavities can pass through openings in the planar semiconductor material layer 10 and the optional planar conductive material layer 6. The photoresist layer can be removed, for example, by ashing.

At least one conductive material can be simultaneously deposited in the through-dielectric via cavities. The at least one conductive material can include, for example, a metallic nitride liner (such as a TiN liner) and a metal fill material (such as W, Cu, Al, Ru, or Co). Excess portions of the at least one conductive material can be removed from the through-dielectric via cavities. For example, excess portions of the at least one conductive material can be removed from above the top surface of the second contact level dielectric layer 282 by a planarization process such as chemical mechanical planarization and/or a recess etch. Each remaining portion of the at least one conductive material in the through-dielectric via cavities that contacts a top surface of a respective one of the topmost lower metal line structure 788 constitutes a through-dielectric contact via structure 488.

Referring to FIG. 14, at least one upper interconnect level dielectric layer 284 can be formed over the contact level dielectric layers (280, 282). Various upper interconnect level metal structures can be formed in the at least one upper interconnect level dielectric layer 284. For example, the various upper interconnect level metal structures can include line level metal interconnect structures (96, 98). The line level metal interconnect structures (96, 98) can include upper metal line structures 96 that contact a top surface of a respective one of the through-dielectric contact via structures 488, and bit lines 98 that contact a respective one of the drain contact via structures 88 and extend along the second horizontal direction (e.g., bit line direction) hd2 and perpendicular to the first horizontal direction (e.g., word line direction) hd1. In one embodiment, a subset of the upper metal line structures 96 may contact, or are electrically coupled to, a respective pair of a word line contact via structure 86 and a through-dielectric contact via structure 488.

Generally, memory stack structures 55 and an alternating stack (132, 146, 232, 246) of insulating layers (132, 232) and electrically conductive layers (146, 246) are formed over the silicon nitride diffusion barrier layer 766. The alternating stack (132, 146, 232, 246) includes stepped surfaces in which each electrically conductive layer (146, 246) other than a topmost electrically conductive layer laterally extends farther than an overlying electrically conductive layer. A contact level dielectric layer (280, 282) is formed over the alternating stack (132, 146, 232, 246) and the memory stack structures 55. Word line contact via structures 86 are formed on top surfaces of the electrically conductive layers (146, 246).

At least a subset of the upper metal interconnect structures (which include the line level metal interconnect structures (96, 98)) is formed over the three-dimensional memory array. A through-dielectric contact via structure 488 can be provided through the retro-stepped dielectric material portions (165, 265), the at least one second dielectric material layer 768, and the silicon nitride diffusion barrier layer 766 and directly on a top surface of another lower metal line structure (e.g., another topmost lower metal line structure 788) of the lower metal interconnect structures 780. A line level dielectric layer 284 is formed over the contact level dielectric layer (280, 282). Bit lines 98 which are electrically connected to a respective subset of the drain contact via structures 63 can be formed in the line level dielectric layer 284.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, bottom ends of the memory stack structures 55 contact a planar semiconductor material layer 10, and the monolithic three-dimensional NAND memory device comprises an array of monolithic three-dimensional NAND strings over the planar semiconductor material layer 10.

At least one memory cell in a first device level of the array of monolithic three-dimensional NAND strings is located over another memory cell in a second device level of the array of monolithic three-dimensional NAND strings. The at least one semiconductor device 710 comprises an integrated circuit comprising a driver circuit for monolithic three-dimensional NAND memory device located thereon. The electrically conductive layers (146, 246) comprise a plurality of control gate electrodes having a strip shape extending substantially parallel to the top surface of the substrate 9.

The plurality of control gate electrodes comprises at least a first control gate electrode located in the first device level and a second control gate electrode located in the second device level. The array of monolithic three-dimensional NAND strings comprises a plurality of semiconductor channels (59, 11, 60), wherein at least one end portion 60 of each of the plurality of semiconductor channels (59, 11, 60) extends substantially perpendicular to a top surface of the semiconductor substrate, and a plurality of charge storage elements (as embodied as portions of the charge storage layers 54 located at levels of the electrically conductive layers (146, 246)), each charge storage element located adjacent to a respective one of the plurality of semiconductor channels (59, 11, 60).

Referring to FIGS. 15A-15C, a stack including, from bottom to top, a first (e.g., lower) silicon nitride layer 362 and a second (e.g., upper) silicon nitride layer 364 can be formed on the top surfaces of the bit lines 98 and the line level dielectric layer 284. Generally, the stack of the first and second silicon nitride layers (362, 364) can be formed at any level over the memory stack structures 55 and over the word line contact via structures 86. In one embodiment, the stack of the first and second silicon nitride layers (362, 364) can be formed over the contact level dielectric layer(s) (280, 282). While the present disclosure is described employing embodiments in which the stack of the first and second silicon nitride layers (362, 364) is formed on the top surfaces of the bit lines 98 and the line level dielectric layer 284, embodiments are expressly contemplated herein in which the stack of the first and second silicon nitride layers (362, 364) is formed directly on a top surface of the second insulating cap layer 270, the first contact level dielectric layer 280, the second contact level dielectric layer 282, or another dielectric material layer formed above the line level dielectric layer 284.

The first silicon nitride layer 362 is formed as a "hydrogen-rich" silicon nitride layer, and the second silicon nitride layer 364 is formed as a "hydrogen-poor" silicon nitride layer which has a lower hydrogen concentration than the first silicon nitride layer 362. In one embodiment, the first silicon nitride layer 362 can include a first hydrogen-to-nitrogen atomic ratio greater than 0.03, and the second silicon nitride layer includes a second hydrogen-to-nitrogen ratio less than 0.01. In one embodiment, the first hydrogen-to-nitrogen ratio can be in a range from 0.03 to 0.08, such as from 0.04 to 0.06, and the second hydrogen-to-nitrogen ratio can be in a range from 0.001 to 0.01, such as from 0.002 to 0.006. In one embodiment, first silicon nitride layer 362 has at least two times, such as two to four times, as much hydrogen as the second silicon nitride layer 364.

In one embodiment, first silicon nitride layer 362 and the second silicon nitride layer 364 can be formed by plasma enhanced chemical vapor deposition processes at a respective deposition temperature not higher than 450 degrees Celsius with different gas flow conditions. In one embodiment, each of the first and second silicon nitride layers (362, 364) can be deposited employing silane and ammonia as reactant gases and nitrogen gas as a carrier gas.

In one embodiment, the ratio of the ammonia flow rate to the silane flow rate during deposition of the first silicon nitride layer 362 can be greater than the ratio of the ammonia flow rate to the silane flow rate during deposition of the second silicon nitride layer 364, such as form example by a factor in a range from 1.25 to 2.5, such as from 1.4 to 2.0. In one embodiment, a first RF power employed during deposition of the first silicon nitride layer 362 is greater than a second RF power employed during deposition of the second silicon nitride layer 364. For example, the ratio of the first RF power employed during deposition of the first silicon nitride layer 362 to the second RF power employed during deposition of the second silicon nitride layer 364 can be in a range from 1.25 to 2.5, such as from 1.4 to 2.0.

In one embodiment, a pressure of the reaction chamber employed during deposition of the first silicon nitride layer 362 is greater than a pressure of the reaction chamber employed during deposition of the second silicon nitride layer 364. For example, a ratio of the pressure of the reaction chamber employed during deposition of the first silicon nitride layer 362 to the pressure of the reaction chamber employed during deposition of the second silicon nitride layer 364 can be in a range from 1.25 to 2.5, such as from 1.5 to 1.75. Nitrogen can be employed as a carrier gas during deposition of the first and second silicon nitride layers (362, 364).

In a non-limiting illustrative example, the substrate 8 may be a commercially available 12" diameter silicon substrate, and the exemplary structure can include various material portion formed on the substrate 8 as described above. In this case, deposition of the first silicon nitride layer 362 can be performed by placing the exemplary structure of FIG. 14 into a plasma enhanced chemical vapor deposition (PECVD) chamber for processing a 12" semiconductor substrate, and by flowing a gas mixture of 15,000 to 20,000, such as 17,000 to 18,000 standard cubic centimeters per minute (sccm) of nitrogen gas, 130 to 180, such as 150 to 160 standard cubic centimeters per minute (sccm) of ammonia, and 250 to 350 sscm, such as 275 to 300 standard cubic centimeters per minute of silane. The pressure of the process chamber can be maintained at about 4.3 to 5 torr, such as 4.5 to 4.6 Torr. The spacing between the showerhead and the 12" substrate can be about 500 to 600 mils, for example 550 to 560 mils, and the applied RF power can be about 800 to 900 Watts, such as 825 to 850 Watts. In this case, the deposited silicon nitride film for the first silicon nitride layer 362 can have the first hydrogen-to-nitrogen atomic ratio of about 0.048 to 0.053, such as 0.05 and 0.051 as measured by Fourier transform infrared spectroscopy (FTIR) as a ratio a Si—H peak to a Si—N peak. Typical silicon nitride deposited by plasma enhanced chemical vapor deposition has a hydrogen-to-nitrogen atomic ratio of about 0.02.

In a non-limiting illustrative example, deposition of the second silicon nitride layer 364 can be performed by placing the exemplary structure with the first silicon nitride layer 362 deposited thereupon into the same process chamber, or into another plasma enhanced chemical vapor deposition (PECVD) chamber for processing a 12" semiconductor substrate, and by flowing a gas mixture of 15,000 to 20,000, such as 17,000 to 18,000 standard cubic centimeters per minute (sccm) of nitrogen gas, 130 to 180, such as 150 to 160 standard cubic centimeters per minute (sccm) of ammonia, and 470 to 550, such as 490 to 510 standard cubic centimeters per minute of silane. The pressure of the process chamber can be maintained at about 4 to 4.5 torr, such as 4.1 to 4.2 Torr. The spacing between the showerhead and the 12" substrate can be about 500 to 600 mils, for example 550 to 560 mils, and the applied RF power can be about 500 to 600 Watts, such as 525 to 550 Watts. In this case, the deposited silicon nitride film for the second silicon nitride layer 364 can have the second hydrogen-to-nitrogen atomic ratio of about 0.003 to about 0.007, such as about 0.004 to about 0.005 as measured by Fourier transform infrared spectroscopy (FTIR) as a ratio a Si—H peak to a Si—N peak.

In one embodiment, the first silicon nitride layer has a first thickness in a range from 10 nm to 500 nm, such as from 60 nm to 300 nm, although lesser and greater thicknesses can also be employed. The second silicon nitride layer has a second thickness in a range from 10 nm to 200 nm, such as from 30 nm to 100 nm, although lesser and greater thicknesses can also be employed.

Hydrogen atoms are present in the first silicon nitride layer 362 at a high atomic concentration as schematically illustrated in FIG. 15B. For example, the atomic concentration of hydrogen in the first silicon nitride layer 362 can be in a range from about 1.7% to about 4.6% (corresponding to the first hydrogen-to-nitrogen ratio from 0.03 to 0.08), such as from about 2.3% to about 3.4% (corresponding to the first hydrogen-to-nitrogen ratio from 0.04 to 0.06).

In one embodiment, the vertical semiconductor channels 60 can include, or can consist essentially of, undoped amorphous silicon, undoped polysilicon, p-doped or n-doped amorphous silicon, p-doped or n-doped polysilicon, an undoped silicon-germanium alloy, or a p-doped or n-doped silicon-germanium alloy. In one embodiment, the vertical semiconductor channels 60 can have an atomic concentration of silicon in a range from 98% to 100%. In one embodiment, the vertical semiconductor channels 60 can include, or consist essentially of, undoped polysilicon, p-doped polysilicon, or n-doped polysilicon. The silicon atoms in the vertical semiconductor channels 60 can have dangling bonds (DB) at grain boundaries as illustrated in FIG. 15C.

Referring to FIGS. 16A-16D, an anneal process can be performed at an elevated temperature. The anneal process can induce formation of hydrogen bonds within the semiconductor material in the vertical semiconductor channels 60 by diffusing hydrogen atoms from the first silicon nitride layer 362 into the vertical semiconductor channels 60. The second silicon nitride layer 364 includes hydrogen atoms at a low atomic concentration, and thus, does not provide hydrogen diffusion paths therethrough. Thus, the second silicon nitride layer 364 blocks diffusion of hydrogen atom therethrough during the anneal process. In contrast, the first silicon nitride layer 362 includes hydrogen at high atomic concentration, and thus, functions as a hydrogen supply source during the anneal process. Further, the high concentration of hydrogen atoms in the first silicon nitride layer provides porous paths through which hydrogen atoms can diffuse into the underlying dielectric material layers such as the line level dielectric layer 284 and the first and second contact level dielectric layers (280, 282). The hydrogen atoms that diffuse to the first contact level dielectric layer 280 can diffuse into the vertical semiconductor channels 60 through top surfaces of the vertical semiconductor channels 60 or through the alternating stacks (132, 146, 232, 246) and through the memory films 50. Exemplary hydrogen diffusion paths HDP are illustrated in FIGS. 16A, 16B, and 16C.

The elevated temperature of the anneal process and the duration of the anneal process can be selected to provide sufficient hydrogen diffusion out of the first silicon nitride layer 362 into the vertical semiconductor channels 60. In one embodiment, the elevated temperature can be in a range from 300 degrees Celsius to 800 degrees Celsius. In one embodiment, the elevated temperature can be maintained for a duration in a range from 10 seconds to 24 hours, such as from 1 minute to 1 hour, during the anneal process.

In one embodiment, duration of the anneal process and the elevated temperature can be selected such that the ratio of the total number of dangling bonds DB in the vertical semiconductor channels 60 to the total number of hydrogen bonds (illustrated in FIG. 16D) in the vertical semiconductor channels 60 can be in a range from 0 to 0.25 after the anneal process. In other words, at least 80% all dangling bonds DB in the vertical semiconductor channels 60 can be converted into hydrogen bonds by the anneal process. In one embodiment, the anneal process may be employed as an activation anneal process that activates the dopant atoms in the source regions 61, in the vertical semiconductor channels 60, and in the drain regions 63.

In one embodiment, the vertical semiconductor channels 60 can comprise, and/or can consist essentially of, polysilicon. The atomic concentration of silicon in the polysilicon material of the vertical semiconductor channels 60 can be in a range from 98% to 99.999999%, such as from 99% to 99.9999% after the anneal process. The balance percentage is primarily attributable to p-type dopant atoms or n-type dopant atoms, and hydrogen atoms in the hydrogen bonds.

The silicon nitride diffusion barrier layer 766 can function as a hydrogen-blocking layer during the anneal process. Thus, the hydrogen atoms can be trapped between the silicon nitride diffusion barrier layer 766 and the second silicon nitride layer 364 during the anneal process. In one embodiment, the silicon nitride diffusion barrier layer 766 can have a hydrogen-to-nitrogen ratio less than 0.01 prior to, and after, the anneal process.

Referring to FIG. 17, the first and second silicon nitride layers (362, 364) can be removed selective to the line level dielectric layer 284 and the upper metal interconnect structures (96, 98) embedded therein. In one embodiment, the first and second silicon nitride layers (362, 364) can be removed by a single etch process. In an illustrative example, a wet etch process employing hot phosphoric acid can be employed to remove the first and second silicon nitride layers (362, 264).

Referring to FIG. 18, at least one interconnect level dielectric layer 290 embedding additional metal interconnect structures (292, 294, 296, 298) can be formed over the over the vertical semiconductor channels 60 after removal of the first and second silicon nitride layers (362, 364). The additional metal interconnect structures (292, 294, 296, 298) can be formed in the at least one interconnect level dielectric layer 290 level by level. The additional metal interconnect structures (292, 294, 296, 298) can include metal via structures (292, 296) and metal line structures (294, 298). While two levels of metal via structures (292, 296) and two levels of metal line structures (204, 298) are illustrated herein, it is understood that as many levels of metal via structures (292, 296) and as many levels of metal line structures (294, 298) can be formed. Each layer within the at least one interconnect level dielectric layer 290 includes a dielectric material such as undoped silicate glass, doped silicate glass, or organosilicate glass. In one embodiment, a subset of the additional metal interconnect structures (292, 294, 296, 298) can be electrically shorted to an upper end of a respective one of the vertical semiconductor channels 60.

In one embodiment, a passivation silicon nitride layer 368 can be formed over the at least one interconnect level dielectric layer 290. The passivation silicon nitride layer 368 can be a diffusion barrier layer for hydrogen atoms. The atomic concentration of hydrogen atoms in the passivation silicon nitride layer 368 can be less than 0.5%, and the thickness of the passivation silicon nitride layer 368 can be in a range from 50 nm to 500 nm, although lesser and greater thicknesses can also be employed.

The processing temperature of all processes after removal of the first and second silicon nitride layers (362, 364) can be maintained below 600 degrees, and preferably below 500 degrees to minimize loss of hydrogen atoms from the vertical semiconductor channels 60. Formation of the passivation silicon nitride layer 368 can trap the hydrogen atoms in the vertical semiconductor channels 60 between the silicon nitride barrier layer 766 and the passivation silicon nitride layer 368, thereby minimizing loss of hydrogen passivation during operation of the semiconductor devices.

Hydrogen passivation of the vertical semiconductor channels 60 can increase the cell current, i.e., the electrical current through each vertical semiconductor channel 60, by a percentage in a range from 1% to 10%, such as from 2% to 8%. The increase in the cell current can be advantageously employed to provide faster device performance and/or increases sense margin.

The methods of the present disclosure provide a high degree of hydrogen passivation in the vertical semiconductor channels 60 by employing an on-substrate structure, i.e., the first silicon nitride layer 362, as a hydrogen source. By providing the hydrogen source in proximity to the memory stack structures 55 prior to formation of the additional metal interconnect structures (292, 294, 296, 298), the efficiency of hydrogen passivation during the anneal process can be enhanced. By removing the first and second silicon nitride layers (362, 364) prior to formation of the metal interconnect structures (292, 294, 296, 298), capacitance increase due to presence of a silicon nitride material is avoided. The methods of the present disclosure can increase the cell current of vertical field effect transistors without the adverse impact of introducing a high dielectric constant material such as a silicon dielectric layer in signal paths within the interconnect dielectric layers.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming memory stack structures vertically extending through an alternating stack of insulating layers and electrically conductive layers over a substrate, wherein each of the memory stack structures comprises a memory film and a vertical semiconductor channel laterally surrounded by the memory film;
   forming a stack including, from bottom to top, a first silicon nitride layer and a second silicon nitride layer over the memory stack structures, wherein the first silicon nitride layer has a higher hydrogen-to-nitrogen ratio than the second silicon nitride layer;
   performing an anneal process to diffuse hydrogen from the first silicon nitride layer into the memory stack structures; and
   removing the first and second silicon nitride layers.

2. The method of claim 1, wherein:
   the semiconductor channels of the memory stack structures comprise polysilicon channels having dangling bonds; and
   the anneal process passivates the dangling bonds in the polysilicon channels by diffusing the hydrogen from the first silicon nitride layer into the polysilicon channels while the second silicon nitride layer blocks diffusion of hydrogen therethrough.

3. The method of claim 1, wherein the first silicon nitride layer includes a first hydrogen-to-nitrogen atomic ratio greater than 0.03, and the second silicon nitride layer includes a second hydrogen-to-nitrogen ratio less than 0.01.

4. The method of claim 3, wherein the first silicon nitride layer and the second silicon nitride layer are formed by plasma enhanced chemical vapor deposition processes at a respective deposition temperature not higher than 450 degrees Celsius with different gas flow conditions.

5. The method of claim 4, wherein each of the first and second silicon nitride layers is deposited employing silane and ammonia as reactant gases and nitrogen gas as a carrier gas.

6. The method of claim 5, wherein a ratio of an ammonia flow rate to a silane flow rate during deposition of the first silicon nitride layer is greater than a ratio of an ammonia flow rate to a silane flow rate during deposition of the second silicon nitride layer by a factor in a range from 1.25 to 2.5.

7. The method of claim 5, wherein a ratio of a first RF power employed during deposition of the first silicon nitride layer to a second RF power employed during deposition of the second silicon nitride layer is in a range from 1.25 to 2.5.

8. The method of claim 1, further comprising:
forming drain regions at upper ends of the vertical semiconductor channels;
forming a contact level dielectric layer over the drain regions;
forming drain contact via structures through the contact level dielectric layer on the drain regions, wherein the first and second silicon nitride layers are formed over the contact level dielectric layer.

9. The method of claim 8, further comprising:
forming a line level dielectric layer over the contact level dielectric layer; and
forming bit lines electrically connected to a respective subset of the drain contact via structures in the line level dielectric layer, wherein the first silicon nitride layer is formed on top surfaces of the bit lines and the line level dielectric layer.

10. The method of claim 1, wherein:
the elevated temperature is in a range from 300 degrees Celsius to 800 degrees Celsius;
the elevated temperature is maintained for a duration in a range from 10 seconds to 24 hours during the anneal process;
the first silicon nitride layer has a first thickness in a range from 10 nm to 500 nm; and
the second silicon nitride layer has a second thickness in a range from 10 nm to 200 nm.

11. The method of claim 1, wherein the first and second silicon nitride layers are removed by a single etch process.

12. The method of claim 11, wherein the first and second silicon nitride layers are removed by a wet etch process employing hot phosphoric acid.

13. The method of claim 1, further comprising:
forming at least one interconnect level dielectric layer over the vertical semiconductor channels after removal of the first and second silicon nitride layers;
forming metal interconnect structures in the at least one interconnect level dielectric layer, wherein a subset of the metal interconnect structures is electrically shorted to an upper end of a respective one of the vertical semiconductor channels; and
forming a passivation silicon nitride layer over the at least one interconnect level dielectric layer, wherein the passivation silicon nitride layer is a diffusion barrier layer for hydrogen atoms.

14. The method of claim 2, wherein duration of the anneal process and the elevated temperature are selected such that a ratio of a total number of the dangling bonds in the vertical semiconductor channels to a total number of hydrogen bonds in the vertical semiconductor channels is in a range from 0 to 0.25 after the anneal process.

15. The method of claim 2, wherein the vertical semiconductor channel comprises polysilicon with an atomic concentration of silicon in a range from 98% to 99.999999% after the anneal process.

16. The method of claim 3, wherein:
the first hydrogen-to-nitrogen ratio is in a range from 0.03 to 0.08; and
the second hydrogen-to-nitrogen ratio is in a range from 0.001 to 0.01.

17. The method of claim 1, further comprising:
forming semiconductor devices on a top surface of the substrate;
forming lower interconnect level dielectric layers embedding lower metal interconnect structures therein over the semiconductor devices, wherein the lower metal interconnect structures are electrically connected to a respective one of the semiconductor devices; and
forming a silicon nitride diffusion barrier layer over the lower interconnect level dielectric layer, wherein:
the memory stack structures and the alternating stack of insulating layers and electrically conductive layers are formed over the silicon nitride diffusion barrier layer; and
the silicon nitride diffusion barrier layer blocks diffusion of hydrogen atoms therethrough during the anneal process.

18. The method of claim 17, wherein the silicon nitride diffusion barrier layer has a hydrogen-to-nitrogen ratio less than 0.01 prior to, and after, the anneal process.

19. The method of claim 1, wherein:
the alternating stack includes stepped surfaces in which each electrically conductive layer other than a topmost electrically conductive layer laterally extends farther than an overlying electrically conductive layer;
the method further comprises forming contact via structures on top surfaces of the electrically conductive layers; and
the first and second silicon nitride layers are formed over the contact via structures.

20. The method of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings formed over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the array of monolithic three-dimensional NAND strings;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *